United States Patent
Limberg

(10) Patent No.: US 8,271,849 B2
(45) Date of Patent: Sep. 18, 2012

(54) M/H FRAME ENCODING AND DECODING TECHNIQUES FOR 8VSB DTV BROADCASTING SYSTEMS

(75) Inventor: Allen LeRoy Limberg, Port Charlotte, FL (US)

(73) Assignee: Samsung Electronics Co., Ltd., Suwon-si (KR)

( * ) Notice: Subject to any disclaimer, the term of this patent is extended or adjusted under 35 U.S.C. 154(b) by 602 days.

(21) Appl. No.: 12/533,604

(22) Filed: Jul. 31, 2009

(65) Prior Publication Data

US 2010/0037120 A1 Feb. 11, 2010

Related U.S. Application Data

(60) Provisional application No. 61/137,960, filed on Aug. 5, 2008, provisional application No. 61/189,481, filed on Aug. 20, 2008, provisional application No. 61/191,107, filed on Sep. 6, 2008.

(51) Int. Cl.
*H03M 13/00* (2006.01)
*H03M 13/03* (2006.01)

(52) U.S. Cl. ........................... 714/755; 714/776
(58) Field of Classification Search ............... 714/755, 714/776
See application file for complete search history.

(56) References Cited

U.S. PATENT DOCUMENTS

| | | | | |
|---|---|---|---|---|
| 6,810,502 B2 * | 10/2004 | Eidson et al. | | 714/786 |
| 7,310,768 B2 * | 12/2007 | Eidson et al. | | 714/786 |
| 7,568,147 B2 * | 7/2009 | Eidson et al. | | 714/786 |
| 7,801,181 B2 * | 9/2010 | Song et al. | | 370/478 |
| 7,831,885 B2 * | 11/2010 | Choi et al. | | 714/755 |
| 7,986,715 B2 * | 7/2011 | Song et al. | | 370/470 |
| 8,059,627 B2 * | 11/2011 | Hong et al. | | 370/342 |
| 8,149,744 B2 * | 4/2012 | Song et al. | | 370/310 |
| 2009/0265751 A1 * | 10/2009 | Limberg | | 725/118 |
| 2009/0322961 A1 * | 12/2009 | Limberg | | 348/725 |
| 2009/0323823 A1 * | 12/2009 | Limberg | | 375/240.25 |
| 2011/0113301 A1 * | 5/2011 | Limberg | | 714/755 |
| 2011/0235723 A1 * | 9/2011 | Limberg | | 375/240.25 |

* cited by examiner

*Primary Examiner* — Joseph D Torres
(74) *Attorney, Agent, or Firm* — Sughrue Mion, PLLC

(57) ABSTRACT

Modification of the prior-art M/H system to better suit transmission of internet-protocol (IP) transport packets includes a standard codeword length for a plurality of various options for transverse Reed-Solomon coding of M/H data, which options offer different degrees of forward-error-correction capability. A 235-byte standard codeword length for TRS coding of M/H data allows extending the FIC-Chunks in the Fast Information Channel signaling to double length so as to substantially increase the capability of such signaling to convey information concerning M/H services. In some transmitter apparatus constructed in accordance with aspect of the invention the TRS encoder in the M/H Frame encoder is modified for transmitting the parity bytes of TRS codewords before, rather than after, the data bytes of those TRS codewords.

8 Claims, 14 Drawing Sheets

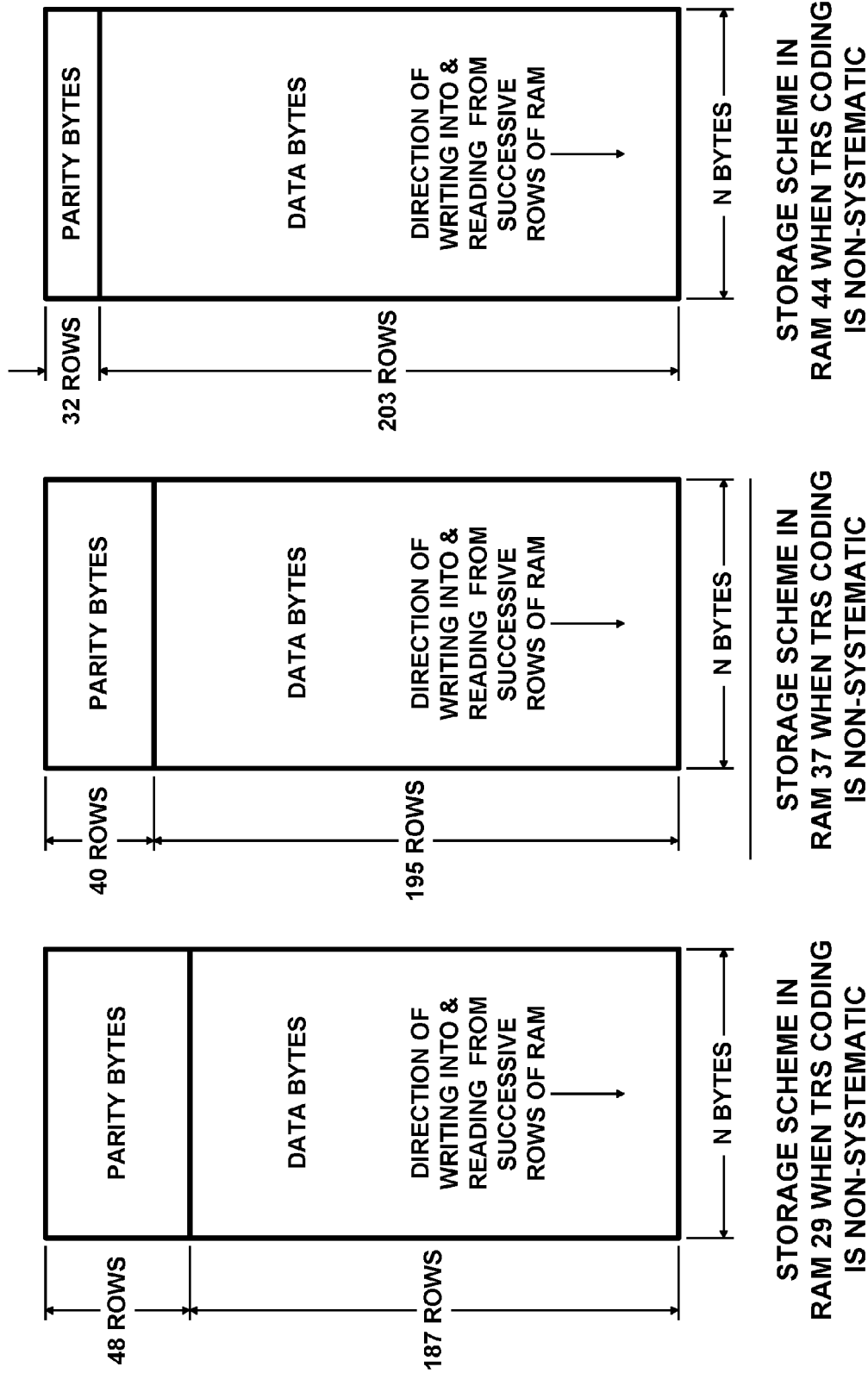

SIGNALING AREA IN THE INTERLEAVED GROUP FORMAT, BEGINS IN THE 17TH OR 173RD SEGMENT OF AN 8VSB FIELD

M/H FRAME ENCODING AND DECODING TECHNIQUES FOR 8VSB DTV BROADCASTING SYSTEMS

This application is filed under 35 U.S.C. 111(a) claiming benefit of the filing dates of provisional U.S. patent application Ser. Nos. 61/137,960, 61/189/481 and 61/191,107 filed on 5 Aug. 2008, 20 Aug. 2008 and 6 Sep. 2008, respectively, which provisional applications are incorporated herein by reference.

The invention relates to the encoding and decoding of transverse Reed-Solomon coding of data used in over-the-air digital television (DTV) broadcasting using 8VSB.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is particularly incorporated by reference into this specification. A/53 describes vestigial-sideband amplitude modulation of the radio-frequency carrier wave using an eight-level modulating signal, which type of over-the-air DTV broadcasting is called "8VSB". In the beginning years of the twenty-first century efforts have been made by some in the DTV industry to provide for more robust transmission of data over broadcast DTV channels without unduly disrupting the operation of so-called "legacy" DTV receivers already in the field. Robust transmission of data for reception by mobile and hand-held receivers is provided for in a Candidate Standard: ATSC Mobile DTV Standard published in June 2009, referred to hereinafter simply as "A/153" for sake of brevity, and incorporated herein by reference. A/153 is directed to transmitting ancillary signals in time division multiplex with 8VSB DTV signals, which ancillary signals are designed for reception by mobile receivers and by hand-held receivers. The ancillary data employ internet protocol (IP) transport streams. The ancillary data are randomized and subjected to transverse Reed-Solomon (TRS) forward-error-correction (FEC) coding before serially concatenated convolutional coding (SCCC) that uses the ⅔ trellis coding of 8VSB as inner convolutional coding.

The operation of nearly all legacy DTV receivers is disrupted if ⅔ trellis coding is not preserved throughout every transmitted data field. Also, the average modulus of the signal should be the same as for 8-VSB signal as specified in the 1995 version of A/53, so as not to disrupt adaptive equalization in legacy receivers using the constant modulus algorithm (CMA).

Another problem concerning "legacy" DTV receivers is that a large number of such receivers were sold that were designed not to respond to broadcast DTV signals unless de-interleaved data fields recovered by trellis decoding were preponderantly filled with (207, 187) Reed-Solomon forward-error-correction (RS FEC) codewords of a specific type or correctable approximations to such codewords. Accordingly, in order to accommodate continuing DTV reception by such legacy receivers, robust transmissions are constrained in the following way. Before convolutional byte interleaving, data fields should be preponderantly filled with (207, 187) RS FEC codewords of the type specified in A/53.

This constraint has led to the M/H data encoded for reception by mobile and hand-held DTV receivers being encapsulated within (207, 187) RS FEC codewords of the general type specified in A/53, differing in that they are not necessarily systematic, with the twenty parity bytes located at the conclusions of the codewords. The twenty parity bytes of some (207, 187) RS FEC codewords appear earlier in the codewords to accommodate the inclusion of training signals in the fields of interleaved data. The 207-byte RS FEC codewords invariably begin with a three-byte header similar to the second through fourth bytes of an MPEG-2 packet, with a thirteen-bit packet-identification (PID) code in the fourth through sixteenth bit positions. Except for the three-byte header and the twenty parity bytes in each (207, 187) RS FEC codeword, the remainder of the codeword is available for "encapsulating" 184 bytes of a robust transmission.

A/153 prescribes successive equal lengths of the M/H data stream being subjected to transverse Reed-Solomon (TRS) coding and then to periodic cyclic-redundancy-check (CRC) coding to develop indications of the possible locations of byte errors in the TRS coding. These procedures are designed to correct byte errors caused by protracted burst noise, particularly as may arise from loss of received signal strength, and are performed in apparatus called an "M/H Frame encoder". The output signal from the M/H Frame encoder is supplied for subsequent serial concatenated convolutional coding (SCCC) of the general sort described by Valter Benedetto in U.S. Pat. No. 5,825,832 issued 20 Oct. 1998 and titled "Method and device for the reception of symbols affected by inter-symbol interface". The encoder for the SCCC comprises an outer convolutional encoder, an interleaver for bit-pairs generated by the outer convolutional encoder, and an inner convolutional encoder constituting the precoder and ⅔ trellis coder prescribed by A/53.

In A/153, the parity bytes generated by the TRS coding are transmitted at the conclusion of 187 successive equal lengths of the M/H data stream used for generating them. TRS coding of M/H data frames extends over 968-millisecond intervals of 8VSB signals. A/153 offers three options for the TRS coding. A/153 permits M/H transmissions to use (211, 187), (223, 187) or (235, 187) TRS coding. The inventor observed that the use of three different lengths of TRS codewords complicates the efficient packing of M/H data frame for one or two of these options. The inventor presumed that the three different lengths of TRS codewords were used in order to accommodate a transport stream composed of fixed-size 187-byte-long MPEG-2-compatible packets, but perceived that such accommodation was unnecessary for the IP transport stream, which uses packets of indeterminate length. The inventor discerned that just one codeword length could be used for all TRS coding options to be offered for a prescribed size of RS Frame, which would facilitate efficient packing of RS Frames of that size.

An initial portion of the TRS coding procedure in the M/H Frame encoder can be analogized to a matrix-type block interleaving procedure of the following sort. A first framestore is written row by row with respective successive equal lengths of the M/H data stream and then read column by column to the Reed-Solomon coder, which generates successive TRS codewords. A final portion of the TRS coding procedure in the M/H Frame encoder can be analogized to a matrix-type block de-interleaving procedure of the following sort. A second framestore is written column by column row by row with respective successive TRS codewords and then read row by row to reproduce respective successive equal lengths of the M/H data stream followed by TRS parity bytes.

In a receiver for M/H signals, turbo decoding of the SCCC'd M/H signal is followed by a TRS decoding and error-correction procedure. An initial portion of the TRS decoding procedure in an M/H Frame decoder can be analogized to a matrix-type block de-interleaving procedure of the following sort. A first framestore is written row by row with respective successive equal lengths of the M/H data stream and ensuing TRS parity and then read column by column to the Reed-Solomon decoder, which generates successive corrected TRS codewords. A final portion of the TRS decoding procedure in the M/H Frame decoder can be analogized to a matrix-type block re-interleaving procedure of the following sort. A second framestore is written column by column row by row with respective corrected TRS codewords and then read row by row to reproduce respective successive equal lengths of error-corrected M/H data stream. The second framestore can be smaller than the first since only the data bytes of the corrected TRS codewords need to be subjected to the block re-interleaving procedure.

The memory for storing RS Frames in the M/H Frame decoder of a DTV receiver is sizable. The inventor discerned there would be a substantial reduction in memory if a single framestore were used both for the matrix-type block de-interleaving procedure to provide TRS codewords to the RS decoder and for the matrix-type block re-interleaving procedure for reproducing M/H data with corrections. The inventor observed that, in order that this can be done, the reading out of error-corrected previous M/H data row by row had to be completed before over-writing by new M/H data.

The M/H Frame decoder in a DTV receiver receives equal-length CRC codewords from a turbo decoder. Turbo decoding involves iterative decoding procedures that are not strictly real-time in nature. The more time that can be allotted to the turbo coding procedures, the less power those procedures are likely to consume. Confining the M/H-encapsulating (MHE) packets of a Group to just the first 118 transfer stream (TS) packets in a 156-TS-packet Slot tends to leave a time interval for performing the TRS decoding operations. The convolutional byte interleaving employed in 8VSB DTV broadcasting causes various delays of the bytes of the 118 TS packets in a Slot, spreading them out over 170 segments of 8VSB data fields. This reduces the time available for performing the TRS decoding operations and re-writing the RS Frame framestore with corrected bytes before it receives new data for over-writing the previous content. To lengthen the time for performing turbo decoding procedures and the subsequent TRS decoding procedures, it is customary for an M/H service to be received just in every fourth one of the M/H Groups that can be transmitted. Most of this time is used for iterated turbo decoding procedures, with the TRS decoding procedure performed in no more than one 8VSB frame interval. The inventor perceived that there is a simple way to extend the time interval for performing the TRS decoding operations. Such extension is beneficial when a single framestore is used both for the matrix-type block de-interleaving procedure to provide TRS codewords to the RS decoder and for the matrix-type block re-interleaving procedure for reproducing M/H data with corrections. The time interval for performing the TRS decoding operations can be extended by transmitting the MHE packets encapsulating portions of the equal-length CRC codewords containing TRS parity bytes before transmitting the MHE packets encapsulating portions of the equal-length CRC codewords containing M/H data bytes. This is because the portion of the framestore used to store TRS parity bytes does not need to be read row by row before being over-written by new TRS parity bytes. The only reading of the TRS parity bytes after their being written row by row into the framestore is the column by column reading to the RS decoder. Each of the TRS codewords used in M/H Frame encoding per A/153 has at least 24 TRS parity bytes extracted from as many MHE packets. Accordingly, the time interval for performing the TRS decoding operation can be extended by at least a factor of 211/187 or almost 1.13.

The M/H transmission system as originally proposed by LG Electronics was designed to transmit an MPEG-2-compatible stream of 187-byte transport packets. However, in ATSC subcommittees it was decided that A/153 should specify that M/H transmissions use internet-protocol (IP) transport packets of indeterminate length. It was subsequently determined that under certain conditions the Fast Information Channel (FIC) when operated according to its original design provided insufficient capability for conveying information. At least one proposal was made to augment the information capacity of the FIC with information from IP packets transmitted in the SCCC. The inventor discerned that augmenting the FIC information with information from IP packets transmitted in the SCCC would lead to undesirable complications in receiver design, which complications could be avoided simply by increasing the capability of the FIC for conveying information. The inventor proposed doubling the number of bytes of FIC in each Chunk to create extended FIC Chunks to double the information capacity of the FIC, doubling the number of FIC Segments in each M/H Group to permit repeating the FIC as often as originally proposed. That is, the inventor proposed extended FIC-Chunks that had 74 times NoG bytes, NoG being the number of M/H Groups in one-fifth of an M/H Frame. However, in an alternative approach to accommodating extended FIC-Chunks, A/153 was amended to specify that FIC-Chunks can be extended in duration and transmitted less frequently in each M/H Frame in order to increase the information capacity of the FIC. This alternative approach avoided SCCC being partly taken up by information for supplementing FIC information. This alternative approach also reduced the need to revise designs of signaling hardware in both transmitters and receivers. The drawback of this alternative approach is possible increase in the times receivers will require to acquire a newly selected channel.

SUMMARY OF THE INVENTION

The invention is directed to modifying the prior-art M/H system so that it is better suited to the transmission of internet-protocol (IP) transport packets. Aspects of the invention concern modifications of the M/H Frame encoder in DTV transmitter apparatus for transmitting 8VSB DTV signals incorporating M/H data. One aspect of the invention is the use of the same codeword length for a plurality of various options for transverse Reed-Solomon coding of M/H data, which options offer different degrees of forward-error-correction (FEC) capability. Another aspect of the invention concerns extending the FIC-Chunks in the Fast Information Channel (FIC) signaling so as to substantially increase the capability of such signaling to convey information concerning M/H services. Another aspect of the invention concerns the TRS encoder in the M/H Frame encoder being modified so that the parity bytes of TRS codewords are transmitted before, rather than after, the data bytes of those TRS codewords. This facilitates TRS decoding being done without requiring receivers to have as much memory for RS Frames.

Other aspects of the invention concern receiver apparatus for reproducing internet-protocol (IP) transport packets transmitted by a transmitter for the M/H system.

BRIEF DESCRIPTION OF THE DRAWING

FIGS. 6, 7 and 8 are diagrams of the storage schemes used in random-access memories shown in FIG. 2 when a non-systematic transverse Reed-Solomon coding is used.

DETAILED DESCRIPTION

The M/H system provides Mobile/Hand-held broadcasting services using a portion of the 19.39 Mbps ATSC 8-VSB transmission, while the rest is still available for high-definition or multiple standard-definition television services. The M/H system is a dual-stream system: the ATSC service multiplex for existing digital television services and the M/H-service multiplex for one or more mobile, pedestrian and hand-held services.

Figure 1:
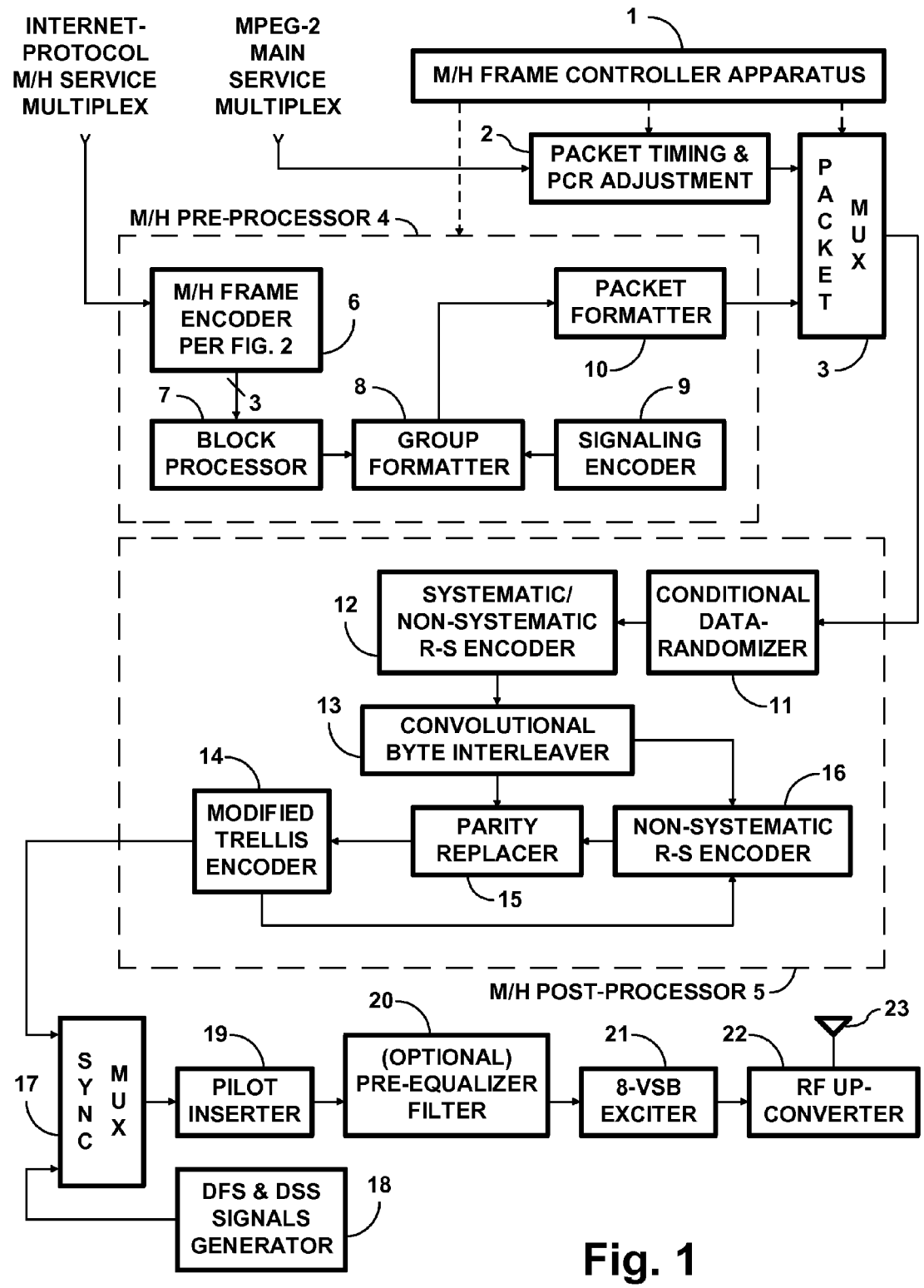
FIG. 1 is a schematic diagram of DTV transmitter apparatus with improved M/H Frame encoder, which DTV transmitter apparatus embodies an aspect of the invention.

FIG. 1 shows transmitter apparatus for broadcast DTV signals using SCCC of M/H type. The transmitter apparatus receives two sets of input streams, one composed of the MPEG transport stream (TS) packets of the main-service data and the other composed of M/H-service data. The M/H-service data are encapsulated in MPEG-like TS packets before emission, which MPEG-like TS packets have been called "M/H encapsulating packets" or more simply "MHE packets". This avoids disrupting the reception of the main-service data by legacy 8-VSB receivers. M/H-service data could be carried in MPEG transport streams, such as MPEG-2 video/audio or MPEG-4 video/audio, but the decision within ATSC is that it be carried by internet-protocol (IP) packets. The FIG. 1 transmitter apparatus combines the MPEG TS packets of the main-service data and the IP TS packets of the M/H-service data within one stream of MPEG or MPEG-like TS packets. Then, the FIG. 1 transmitter apparatus processes the combined stream for transmission as an ATSC trellis-coded 8-VSB signal.

M/H Frame controller apparatus 1 controls these procedures. The main-service multiplex stream of data is supplied to packet timing and PCR adjustment circuitry 2 before the packets of that stream are routed to a packet multiplexer 3 to be time-division multiplexed with packets encapsulating M/H-service data. (PCR is the acronym for "Program Clock Reference".) Because of their time-division multiplexing with the packets encapsulating M/H data, changes have to be made to the time of emission of the main-service stream packets compared to the timing that would occur with no M/H stream present. The packet timing and PCR adjustment circuitry 2 makes these timing changes responsive to control signals supplied thereto from the M/H Frame controller apparatus 1. The packet multiplexer 3 time-division multiplexes the main-service TS packets with TS packets encapsulating M/H-service data, as directed by control signals from the M/H Frame controller apparatus 1. The operations of the M/H transmission system on the M/H data are divided into two stages: the M/H pre-processor 4 and the M/H post-processor 5.

The function of the pre-processor 4 is to rearrange the M/H-service data into an M/H data structure, to enhance the robustness of the M/H-service data by additional FEC processes, to insert training sequences, and subsequently to encapsulate the processed enhanced data within MHE packets, thereby to generate the ancillary transport stream (TS). The operations performed by the pre-processor 4 include M/H Frame encoding, block processing, Group formatting, packet formatting and M/H signaling encoding. The M/H Frame controller apparatus 1 provides the necessary transmission parameters to the pre-processor 4 and controls the multiplexing of the main-service data packets and the M/H-service data packets by the packet multiplexer 3 to organize the M/H Frame.

The function of the post-processor 5 is to process the main-service data by normal 8-VSB encoding and to re-arrange the pre-processed M/H-service data in the combined stream to ensure backward compatibility with ATSC 8-VSB. Main-service data in the combined stream are processed exactly the same way as for normal 8-VSB transmission: randomizing, Reed-Solomon (RS) encoding, convolutional byte interleaving and trellis encoding. The M/H-service data in the combined stream are processed differently from the main-service data, with the pre-processed M/H-service data bypassing data randomization. The pre-processed M/H-service data is subjected to non-systematic RS encoding, which re-arranges their bytes. The non-systematic RS encoding allows the insertion of the regularly spaced long training sequences without disturbing legacy receivers. Additional operations are done on the pre-processed M/H-service data to initialize the trellis encoder memories at the beginning of each training sequence included in the pre-processed M/H-service data.

More specifically, the M/H-service multiplex stream of data is supplied to the M/H pre-processor 4 for processing and subsequent encapsulation in the payload fields of MHE transport packets. The MHE transport packets are supplied to the packet multiplexer 3 after data encapsulation within their payload fields is completed.

Still more specifically, the M/H-service multiplex stream of data is supplied to an M/H Frame encoder 6 which provides transverse Reed-Solomon (TRS) coding of data packets. The data packets are also subjected to periodic cyclic-redundancy-check (CRC) coding to locate byte errors for the TRS coding. Each M/H Frame is composed of one or two frames of the TRS coding, and the data in each frame of the TRS-CRC coding are randomized independently from each other and from the data of the main-service multiplex. FIG. 1 indicates that the M/H Frame encoder 6 is of the sort shown in FIG. 2 of the drawing, which is in accordance with an aspect of the invention relating to DTV transmitter apparatus.

The M/H Frame encoder 6 is connected for supplying packets of M/H-service data to a block processor 7, as input signal thereto. The block processor 7 includes encoders for each type of single-phase outer convolutional coding used in the SCCC and respective subsequent interleavers for successive bit-pairs of each type of single-phase outer convolutional coding.

A Group formatter 8 is connected for receiving the interleaved outer convolutional coding from the block processor 7 as input addressing signal. The Group formatter 8 includes an interleaved Group format organizer that operates on the Group format as it will appear after the ATSC data interleaver. The interleaved Group format organizer maps the FEC coded M/H-service data from the block processor into the corresponding M/H blocks of an M/H Group, adding pre-determined training data bytes and data bytes to be used for initializing the trellis encoder memories. The interleaved Group format organizer inserts 3-byte headers for the MHE packets. The interleaved Group format organizer also inserts placeholder bytes for main-service data and for non-systematic lateral RS parity. The interleaved Group format organizer adds some dummy bytes to complete construction of the intended Group format. The interleaved Group format organizer assembles a succession of 118 consecutive TS packets. Some of these TS packets are composed of the interleaved outer convolutional coding supplied by the block processor 7. Others of these TS packets are prescribed training signals stored in read-only memory within the Group formatter 8 and inserted at prescribed intervals within each M/H Group. Still others of these TS packets are generated by a signaling encoder 9.

The M/H transmission system has two kinds of signaling channels generated by the signaling encoder 9. One is the Transmission Parameter Channel (TPC), and the other is the Fast Information Channel (FIC). The TPC is for signaling the M/H transmission parameters such as various FEC modes and M/H Frame information. The FIC is provided to enable the fast service acquisition of receivers and it contains cross layer information between the physical layer of receivers and their upper layer(s). As noted earlier in this specification, the use of the internet protocol for M/H-service data makes it desirable to increase the capacity of the FIC. Doubling the amount of FIC bytes in each M/H Group is one way of doing this and is described hereinafter in reference to FIG. 10 of the drawing.

Within the Group formatter 8 the interleaved Group format organizer is followed in cascade connection by a byte de-interleaver that complements the ATSC convolutional byte interleaver. The Group formatter 8 is connected for supplying the response of this de-interleaver as its output signal, which is applied as input signal to a packet formatter 10. Initially, the packet formatter 10 expunges the main-service data place holders and the RS parity place holders that were inserted by the interleaved Group format organizer for proper operation of the byte de-interleaver in the Group formatter 8. The packet formatter 10 inserts an MPEG TS sync byte before each 187-byte data packet as a prefix thereof. The packet formatter 10 supplies 118 M/H-data-encapsulating TS packets per M/H Group to the packet multiplexer 3, which time-division multiplexes the M/H-service TS packets and the main-service TS packets to construct M/H Frames.

The M/H Frame controller apparatus 1 controls the packet multiplexer 3 in the following way when the packet multiplexer schedules the 118 TS packets from the packet formatter 10. Thirty-seven packets immediately precede a DFS segment in a 313-segment VSB field of data, and another eighty-one packets immediately succeed that DFS segment. The packet multiplexer 3 reproduces next-in-line main-service TS packets in place of MPEG null packets that contain placeholder bytes for main-service data in their payload fields. The packet multiplexer 3 is connected to supply the TS packets it reproduces to the post-processor 5 as input signal thereto.

More specifically, the packet multiplexer 3 is connected to apply the TS packets it reproduces to a conditional data randomizer 11 as the input signal thereto. The conditional data randomizer 11 suppresses the sync bytes of the 188-byte TS packets and randomizes the remaining data in accordance with conventional 8-VSB practice, but only on condition that it is not encapsulated M/H-service data. The encapsulated M/H-service data bypass data randomization. The other remaining data are randomized per A/53, Annex D, §4.2.2.

An encoder 12 for systematic and non-systematic (207, 187) Reed-Solomon codes is connected to receive, as its input signal, the 187-byte packets that the conditional data randomizer 11 reproduces with conditional data randomization. The RS parity generator polynomial and the primitive field generator for the Reed-Solomon encoder 12 are the same as those A/53, Annex D, FIG. 8 prescribes for (207, 187) Reed-Solomon coding. When the RS encoder 12 receives a main-service data packet, the RS encoder 12 performs the systematic RS coding process prescribed in A/53, Annex D, §4.2.3, appending the twenty bytes of RS parity data to the conclusion of the 187-byte packet. When the RS encoder 12 receives an M/H-service data packet, the RS encoder 12 performs a non-systematic RS encoding process. The twenty bytes of RS parity data obtained from the non-systematic RS encoding process are inserted in a prescribed parity byte location within the M/H data packet.

A convolutional byte interleaver 13 is connected for receiving as its input signal the 207-byte RS codewords that the RS encoder 12 generates. The byte interleaver 13 is generally of the type specified in A/53, Annex D, §4.2.4. The byte interleaver 13 is connected for supplying byte-interleaved 207-byte RS codewords via a Reed-Solomon parity replacer 14 to a modified trellis encoder 15. The basic trellis encoding operation of the modified trellis encoder 15 is similar to that specified in A/53, Annex D, §4.2.4. The trellis encoder 15 converts the byte-unit data from the byte interleaver 13 to symbol units and performs a 12-phase trellis coding process per Section 6.4.1.4 Main Service Trellis Coding of A53-Part-2-2007. In order for the output data of the trellis encoder 15 to include pre-defined known training data, initialization of the memories in the trellis encoder 15 is required. This initialization is very likely to cause the RS parity data calculated by the RS encoder 12 prior to the trellis initialization to be erroneous. The RS parity data must be replaced to ensure backward compatibility with legacy DTV receivers. Accordingly, the trellis encoder is connected for supplying the changed initialization byte to an encoder 16 for non-systematic (207, 187) Reed-Solomon codes, which encoder 16 re-calculates the RS parity of the affected M/H packets. The encoder 16 is connected for supplying the re-calculated RS parity bytes to the RS parity replacer 14, which substitutes the re-calculated RS parity bytes for the original RS parity bytes before they can be supplied to the modified trellis encoder 15. That is, the RS parity replacer 14 reproduces the output of the byte interleaver 13 as the data bytes for each packet in its output signal, but reproduces the output of the non-systematic RS encoder 16 as the RS parity for each packet in its output signal. The RS parity replacer 14 is connected to supply the resulting packets in its output signal to the modified trellis encoder 15 as the input signal thereto.

A synchronization multiplexer 17 is connected for receiving as the first of its two input signals the ⅔ trellis-coded data generated by the modified trellis encoder 15. The sync multiplexer 17 is connected for receiving its second input signal from a generator 18 of synchronization signals comprising the data segment sync (DSS) and the data field sync (DFS) signals. The DSS and DFS are time-division multiplexed with the ⅔ trellis-coded data per custom in the output signal from the sync multiplexer 17, which is supplied to a pilot inserter 19 as input signal thereto. The pilot inserter 19 introduces a direct-component offset into the signal for the purpose of generating a pilot carrier wave during subsequent balanced modulation of a suppressed intermediate-frequency (IF) carrier wave. The output signal from the pilot inserter 19 is a modulating signal, which optionally is passed through a pre-equalizer filter 20 before being supplied as input signal to an 8-VSB exciter 21 to modulate the suppressed IF carrier wave. The 8-VSB exciter 21 is connected for supplying the suppressed IF carrier wave to a radio-frequency up-converter 22 to be converted upward in frequency to repose within the broadcast channel. The up-converter 22 also amplifies the power of the radio-frequency (RF) signal that it applies to the broadcast antenna 23.

Figure 2:
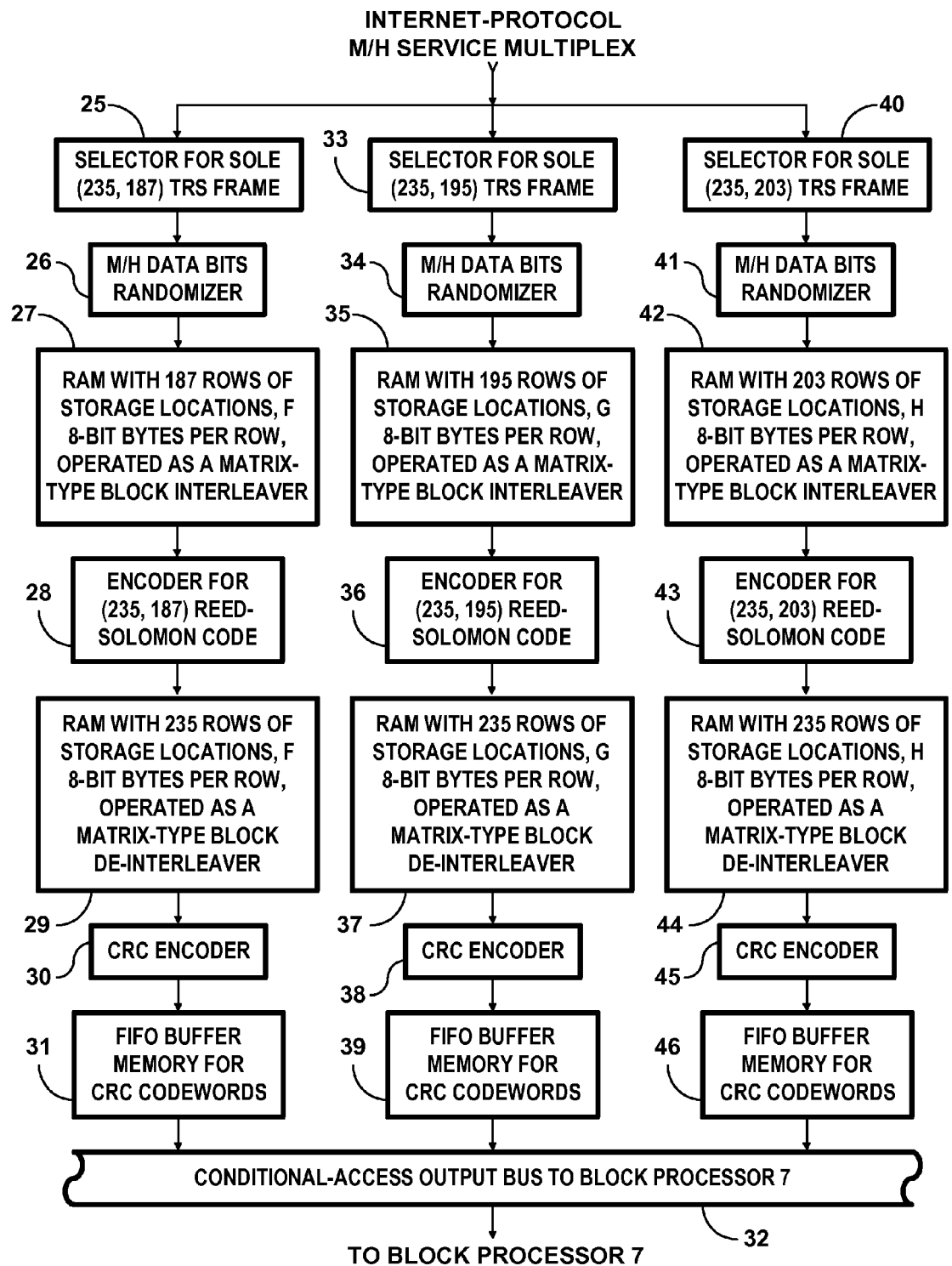
FIG. 2 is a detailed schematic diagram of a representative embodiment of the improved M/H Frame encoder in the FIG. 1 DTV transmitter apparatus.

FIG. 2 shows a representative embodiment of the improved M/H Frame encoder in the FIG. 1 DTV transmitter apparatus. This portion of the improved M/H Frame encoder is used for constructing the sole RS Frame when the M/H Frame encoder employs only a single RS Frame. The total number of byte epochs in blocks B1 through B10 of a Group that the Candidate Standard A/153 makes available for outer convolutional coding of randomized M/H data is 19,248. In the M/H transmission system specified by A/153, each M/H Group is considered to be partitioned into ten successive M/H blocks B1, B2, B3, B4, B5, B6, B7, B8, B9 and B10, each spanning sixteen consecutive 8VSB data segments. Each M/H Group is considered to be composed of four regions A, B, C and D. Region A consists of blocks B4, B5, B6 and B7. Region B consists of blocks B3 and B8. Region C consists of blocks B2 and B9. Region D consists of blocks B1 and B10. If the RS Frame mode of a Parade is specified as "01", indicating the Parade is transmitted as two separate RS Frames, the primary RS Frame is transmitted in Regions A and B of M/H Groups, and the secondary RS Frame is transmitted in Regions C and D of M/H Groups. Regions A and B of an A/153 M/H Group contain 15,288 byte epochs available for TRS-coded and CRC-coded randomized M/H data. Regions C and D of an A/153 Group contain 3,960 byte epochs available for TRS-coded and CRC-coded randomized M/H data.

If the RS Frame mode of a Parade is specified as "00", this indicates that the Parade is transmitted as a sole RS Frame. The sole RS Frame is transmitted in Regions A, B, C and D of Groups, using all 19,248 byte epochs available in each of those Groups for TRS-coded and CRC-coded randomized M/H data. If the outer convolutional coding reduces code rate by a factor of four, there are 19,248÷4=4,812 byte epochs available in a Group for conveying a sole RS Frame. If the outer convolutional coding reduced code rate by a factor of three, there would be 19,248÷3=6,416 byte epochs available in a Group for conveying a sole RS Frame. If the outer convolutional coding reduces code rate by a factor of two, there are 19,248÷2=9,624 byte epochs available in a Group for conveying a sole RS Frame. What is sought is a code length for a shortened 255-byte TRS codeword that will fit close to an integral number of times into the number of byte epochs available in a Group for conveying a sole RS Frame. This facilitates choosing different numbers of Groups for conveying the sole RS Frame that concerns a particular Parade within the MPH frame. A 235-byte TRS code length fits 20 times into 4812 byte epochs with 112 bytes left over, fits 27 times into 6416 byte epochs with 71 bytes left over, and fits 40 times into 9522 byte epochs with 122 bytes left over. A 237-byte TRS code length fits 20 times into 4812 byte epochs with 72 bytes left over, fits 27 times into 6416 byte epochs with 17 bytes left over, and fits 40 times into 9522 byte epochs with 42 bytes left over.

Insofar as a primary RS Frame that is accompanied by a secondary RS Frame is concerned, there are 15,288 byte epochs per Group available for TRS-coded and CRC-coded randomized M/H data. If the outer convolutional coding reduces code rate by a factor of four, there are 15,288÷4=3,822 byte epochs available in a Group for conveying a primary RS Frame. If the outer convolutional coding reduced code rate by a factor of three, there would be 15,288÷3=5,096 byte epochs available in a Group for conveying a primary RS Frame. If the outer convolutional coding reduces code rate by a factor of two, there are 15,288÷2=7,644 byte epochs available in a Group for conveying a primary RS Frame. A 235-byte TRS code length fits 16 times into 3822 byte epochs with 62 bytes left over, 21 times into 5096 byte epochs with 161 bytes left over, and 32 times into 7644 byte epochs with 124 bytes left over. A 237-byte TRS code length fits 16 times into 3822 byte epochs with 30 bytes left over, 21 times into 5096 byte epochs with 79 bytes left over, and 32 times into 7644 byte epochs with 60 bytes left over.

Insofar as a secondary RS Frame is concerned, there are 3,960 byte epochs per Group available for TRS-coded and CRC-coded randomized M/H data. If the outer convolutional coding reduced code rate by a factor of four, there would be 3,960÷4=990 byte epochs available in a Group for conveying a primary RS Frame. If the outer convolutional coding reduced code rate by a factor of three, there would be 3,960÷3=1,320 byte epochs available in a Group for conveying a primary RS Frame. If the outer convolutional coding reduced code rate by a factor of two, there would be 3,960÷2=1,980 byte epochs available in a Group for conveying a primary RS Frame. A 235-byte TRS code length fits four times into 990 byte epochs with 50 bytes left over, five times into 1320 byte epochs with 145 bytes left over, and eight times into 1980 byte epochs with 100 bytes left over. A 237-byte TRS code length fits four times into 990 byte epochs with 42 bytes left over, five times into 1320 byte epochs with 135 bytes left over, and eight times into 1980 byte epochs with 84 bytes left over.

Even 238-byte TRS code lengths can be accommodated by replacing some of the dummy bytes in each M/H Group by M/H data bytes. The inventor prefers for using 235-byte TRS code lengths, however, since A/153 already prescribes (235, 187) TRS codes amongst others, and reception using (235, 187) TRS codes has been tested in the field. Furthermore, the use of 235-byte TRS code lengths facilitates doubling of the amount of FIC information included in each M/H Group.

FIG. 2 shows a selector 25 connected for selectively reproducing portions of the internet-protocol M/H-service multiplex signal for application to an M/H data bits randomizer 26 as input signal thereto. The portions of the M/H-service multiplex signal selectively reproduced by the selector 25 are those that are to have (235, 187) TRS coding. The M/H data bits randomizer 26 exclusive-ORs the bits of these reproduced portions of the IP M/H-service multiplex signal with respective bits from a prescribed pseudo-random binary sequence (PRBS) for generating randomized IP signal supplied as write-input signal to a random-access memory 27. FIG. 2 shows the RAM 27 as having 187 rows of storage locations capable of storing a number F of eight-bit bytes per row. The RAM 27 is operated as a matrix-type block interleaver in which columns of 187 bytes are read to an encoder 28 that generates a respective (235, 187) Reed-Solomon codeword responsive to each column of 187 bytes read thereto. That is, the RAM 27 is written row by row with successive bytes of IP packets. When writing or over-writing of the storage locations in the RAM 27 has been completed, those bytes are subsequently read column by column to the encoder 28. Each (235, 187) RS codeword generated by the encoder 28 includes 48 parity bytes besides the original 187 bytes of data. The encoder 28 is connected for writing the (235, 187) RS codewords it generates to a random-access memory 29 operated as a matrix-type block de-interleaver. FIG. 2 shows the RAM 29 as having 235 rows of storage locations capable of storing the number F of eight-bit bytes per row. The bytes of the successive (235, 187) RS codewords generated by the encoder 28 are written column by column into the RAM 29. When writing or over-writing of the storage locations in the RAM 29 has been completed, those bytes are subsequently read row by row to a cyclic-redundancy-check encoder 30. The CRC encoder 30 appends two bytes of CRC parity to the conclusion of every chunk of bytes read from a respective row of the RAM 29, thereby generating a respective CRC codeword. The CRC encoder 30 is connected for writing the CRC codewords it generates to a first-in/first-out buffer memory 31 for CRC codewords. The FIFO buffer memory 31 is connected for supplying those CRC codewords to a conditional-access output bus 32 for input signal to the block processor 7.

FIG. 2 shows a selector 33 connected for selectively reproducing portions of the internet-protocol M/H-service multiplex signal for application to an M/H data bits randomizer 34 as input signal thereto. The portions of the M/H-service multiplex signal selectively reproduced by the selector 25 are those that are to have (235, 195) TRS coding, which replaces the (223, 187) TRS coding that A/153 offers as an option and has somewhat greater forward-error-correction capability than (223, 187) TRS coding. The M/H data bits randomizer 34 exclusive-ORs the bits of these reproduced portions of the IP M/H-service multiplex signal with respective bits from a prescribed pseudo-random binary sequence (PRBS) for generating randomized IP signal supplied as write-input signal to a random-access memory 35. FIG. 2 shows the RAM 35 as having 195 rows of storage locations capable of storing the number G of eight-bit bytes per row. The RAM 35 is operated as a matrix-type block interleaver in which columns of 195 bytes are read to an encoder 36 that generates a respective (235, 195) Reed-Solomon codeword responsive to each column of 195 bytes read thereto. That is, the RAM 35 is written row by row with successive bytes of IP packets. When writing or over-writing of the storage locations in the RAM 35 has been completed, those bytes are subsequently read column by column to the encoder 36. Each (235, 195) RS codeword generated by the encoder 36 includes 40 parity bytes besides the original 195 bytes of data. The encoder 36 is connected for writing the (235, 195) RS codewords it generates to a random-access memory 37 operated as a matrix-type block de-interleaver. FIG. 2 shows the RAM 37 as having 235 rows of storage locations capable of storing the number G of eight-bit bytes per row. The bytes of the successive (235, 195) RS codewords generated by the encoder 36 are written column by column into the RAM 37. When writing or over-writing of the storage locations in the RAM 37 has been completed, those bytes are subsequently read row by row to a cyclic-redundancy-check encoder 38. The CRC encoder 38 appends two bytes of CRC parity to the conclusion of every chunk of bytes read from a respective row of the RAM 37, thereby generating a respective CRC codeword. The CRC encoder 38 is connected for writing the CRC codewords it generates to a first-in/first-out buffer memory 39 for CRC codewords. The FIFO buffer memory 39 is connected for supplying those CRC codewords to the conditional-access output bus 32.

FIG. 2 shows a selector 40 connected for selectively reproducing portions of the internet-protocol M/H-service multiplex signal for application to an M/H data bits randomizer 41 as input signal thereto. The portions of the M/H-service multiplex signal selectively reproduced by the selector 25 are those that are to have (235, 203) TRS coding, which replaces the (211, 187) TRS coding that A/153 offers as an option and has somewhat greater forward-error-correction capability than (211, 187) TRS coding. The M/H data bits randomizer 41 exclusive-ORs the bits of these reproduced portions of the IP M/H-service multiplex signal with respective bits from a prescribed pseudo-random binary sequence (PRBS) for generating randomized IP signal supplied as write-input signal to a random-access memory 42. FIG. 2 shows the RAM 42 as having 203 rows of storage locations capable of storing the number H of eight-bit bytes per row. The RAM 42 is operated as a matrix-type block interleaver in which columns of 203 bytes are read to an encoder 43 that generates a respective (235, 203) Reed-Solomon codeword responsive to each column of 203 bytes read thereto. That is, the RAM 42 is written row by row with successive bytes of IP packets. When writing or over-writing of the storage locations in the RAM 42 has been completed, those bytes are subsequently read column by column to the encoder 43. Each (235, 203) RS codeword generated by the encoder 43 includes 32 parity bytes besides the original 203 bytes of data. The encoder 43 is connected for writing the (235, 203) RS codewords it generates to a random-access memory 44 operated as a matrix-type block de-interleaver. FIG. 2 shows the RAM 44 as having 235 rows of storage locations capable of storing the number H of eight-bit bytes per row. The bytes of the successive (235, 203) RS codewords generated by the encoder 43 are written column by column into the RAM 44. When writing or over-writing of the storage locations in the RAM 44 has been completed, those bytes are subsequently read row by row to a cyclic-redundancy-check encoder 45. The CRC encoder 45 appends two bytes of CRC parity to the conclusion of every chunk of bytes read from a respective row of the RAM 44, thereby generating a respective CRC codeword. The CRC encoder 45 is connected for writing the CRC codewords it generates to a first-in/first-out buffer memory 46 for CRC codewords. The FIFO buffer memory 46 is connected for supplying those CRC codewords to the conditional-access output bus 32.

Figure 3:
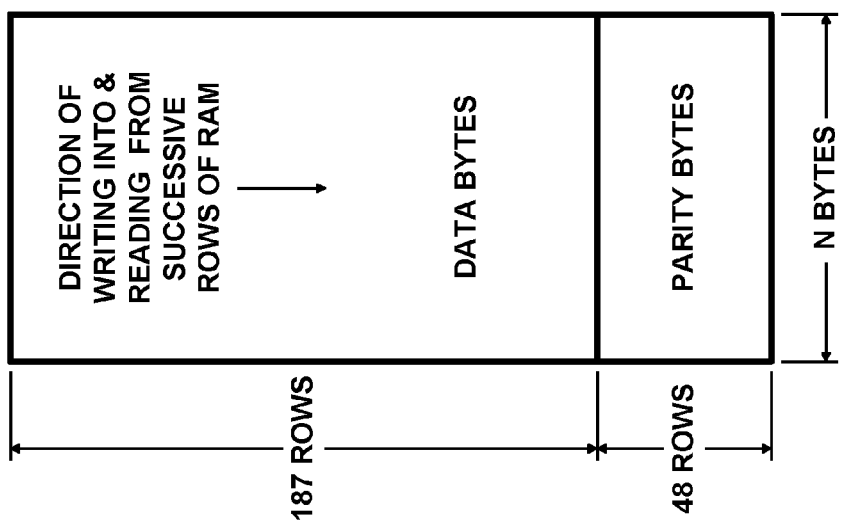

The conditional-access output bus 32 to the block processor 7 grants access just to one of the FIFO buffer memories 31, 39 and 46 at a time, as controlled by the M/H Frame controller apparatus 1 shown in FIG. 1. The writing of the preceding RAMs 29, 37 and 44 proceeds in one way when systematic TRS coding is transmitted, in which the TRS parity bytes of each RS Frame are transmitted after the M/H data bytes therein. The writing of the RAMs 29, 37 and 44 proceeds in another way when using non-systematic TRS coding, in which the TRS parity bytes in the RS Frame are transmitted before the M/H data bytes therein FIG. 3 diagrams the storage scheme used in the RAM 29 of FIG. 2 when systematic transverse Reed-Solomon coding is used. The bytes of (235, 187) RS codewords are written column by column into the RAM 29 from the encoder 28 in such way that the parity bytes are temporarily stored in the RS Frame framestore to be read row by row from the RAM 29 after the data bytes are. The 187 beginning rows 1 through 187 in the RAM 29 temporarily store data bytes, and the 48 concluding rows 188 through 235 in the RAM 29 temporarily store RS parity bytes.

Figure 4:
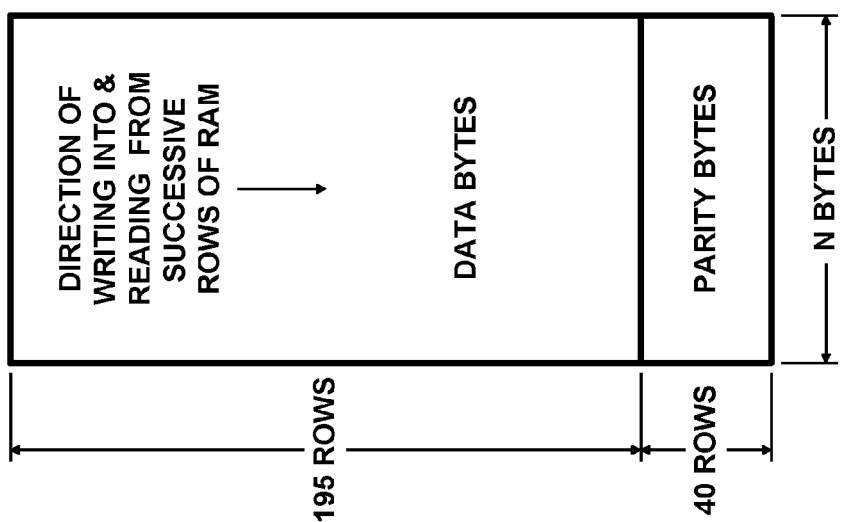

FIG. 4 diagrams the storage scheme used in the RAM 37 of FIG. 2 when systematic transverse Reed-Solomon coding is used. The bytes of (235, 195) RS codewords are written column by column into the RAM 37 from the encoder 36 such that the parity bytes are temporarily stored in the RS Frame framestore to be read row by row from the RAM 37 after the data bytes are. The 195 beginning rows 1 through 195 in the RAM 37 temporarily store data bytes, and the 40 concluding rows 196 through 235 temporarily store RS parity bytes.

Figure 5:
FIGS. 3, 4 and 5 are diagrams of the storage schemes used in random-access memories shown in FIG. 2 when systematic transverse Reed-Solomon coding is used.

FIG. 5 diagrams the storage scheme used in the RAM 44 of FIG. 2 when systematic transverse Reed-Solomon coding is used. The bytes of (235, 203) RS codewords are written column by column into the RAM 44 from the encoder 43 such that the parity bytes are temporarily stored in the RS Frame framestore to be read row by row from the RAM 44 before the data bytes are. The 203 beginning rows 1 through 203 in the RAM 44 temporarily store data bytes, and the 32 concluding rows 203 through 235 in the RAM 44 temporarily store RS parity bytes.

FIG. 6 diagrams the storage scheme used in the RAM 29 of FIG. 2 when non-systematic transverse Reed-Solomon coding is used. The bytes of (235, 187) RS codewords are written column by column into the RAM 29 from the encoder 28 such that the parity bytes are temporarily stored in the RS Frame framestore to be read row by row from the RAM 29 before the data bytes are. The 187 byte-storage locations in the concluding rows 49 through 235 of the RAM 29 are written with the M/H data bytes of an RS Frame before the 48 beginning rows 1 through 48 in the RAM 29 are written with the RS parity bytes for that RS Frame.

FIG. 7 diagrams the storage scheme used in the RAM 37 of FIG. 2 when non-systematic transverse Reed-Solomon coding is used. The bytes of (235, 195) RS codewords are written column by column into the RAM 37 from the encoder 36 such that the parity bytes are temporarily stored in the RS Frame framestore to be read row by row from the RAM 37 before the data bytes are. The 193 byte-storage locations in the concluding rows 41 through 235 of the RAM 37 are written with the M/H data bytes of an RS Frame before the 40 beginning rows 1 through 40 in the RAM 37 are written with the RS parity bytes for that RS Frame.

FIG. 8 diagrams the storage scheme used in RAM 44 of FIG. 2 when non-systematic transverse Reed-Solomon coding is used. The bytes of (235, 203) RS codewords are written column by column into the RAM 44 from the encoder 43 such that the parity bytes are temporarily stored in the RS Frame framestore to be read row by row from the RAM 44 before the data bytes are. The 203 byte-storage locations in the concluding rows 33 through 235 of the RAM 44 are written with the M/H data bytes of an RS Frame before the 32 beginning rows 1 through 32 in the RAM 44 are written with the RS parity bytes for that RS Frame.

Figure 9:
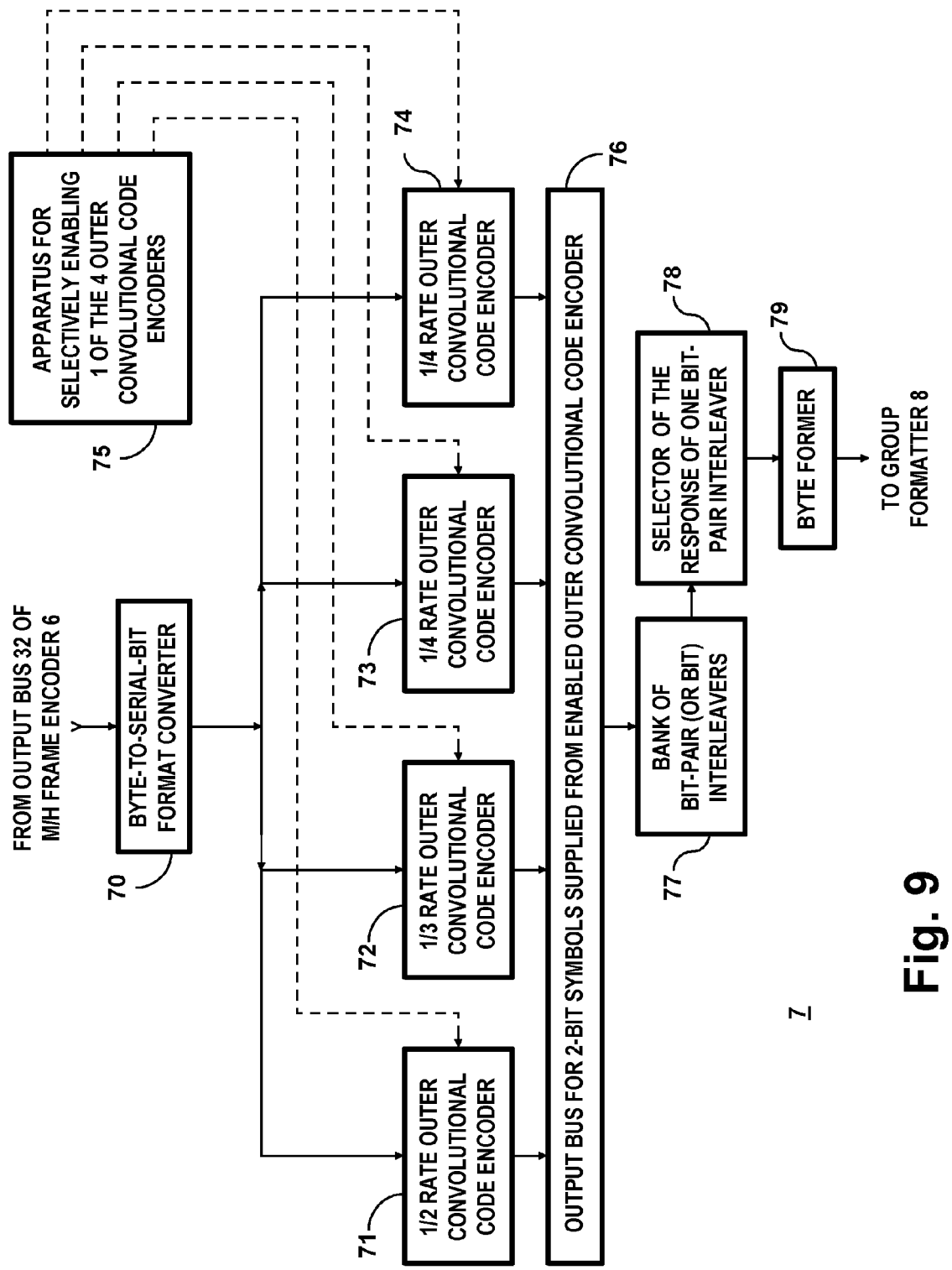
FIG. 9 is a detailed schematic diagram of a representative embodiment of the block processor in the FIG. 1 DTV transmitter apparatus.

FIG. 9 shows a representative embodiment of the block processor 7 in the FIG. 1 DTV transmitter apparatus. The output bus 32 of the M/H Frame encoder 6 is connected for supplying its output signal in 8-bit byte format as input signal to a byte-to-serial-bit format converter 70. The format converter 70 is connected for supplying the M/H Frame encoder 6 response as converted to serial-bit format to encoders 71, 72, 73 and 74 as their respective input signals. By way of specific example, the encoder 71 generates one-half-rate outer convolutional coding as specified in A/153, for example. The encoder 72 generates one-third-rate convolutional coding. By way of specific example, the encoders 73 and 74 generate respective ones of the two types of one-quarter-rate outer convolutional coding specified in A/153. FIG. 9 shows apparatus 75 for selectively enabling operation of the encoders 71, 72, 73 and 74 one at a time. If the encoders 71, 72, 73 and 74 have separate physical structures, the apparatus 75 for selectively enabling operation can by way of example be such as to supply operating power to only a selected one of the four decoders. In actual practice the encoders 71, 72, 73 and 74 usually use elements in common as described or suggested in A/153. In such case the apparatus 75 will comprise selective connection circuitry for selecting the outer convolutional coding with desired rate. FIG. 9 shows the encoders 71, 72, 73 and 74 connected for serially supplying bit-pairs to an output bus 76 for subsequent application to a bank 77 of bit-pair interleavers. These bit-pairs are symbols of half-rate outer convolutional coding, for example, and are half symbols of one-quarter-rate outer convolutional coding, by way of further example. A selector 78 is connected for supplying the response from the selected one of the bank 77 of bit-pair interleavers to a byte former 79, which converts the bit-pairs of interleaver response into 8-bit bytes for application to the Group formatter 8 as one of the input signals thereto.

Figure 10A:
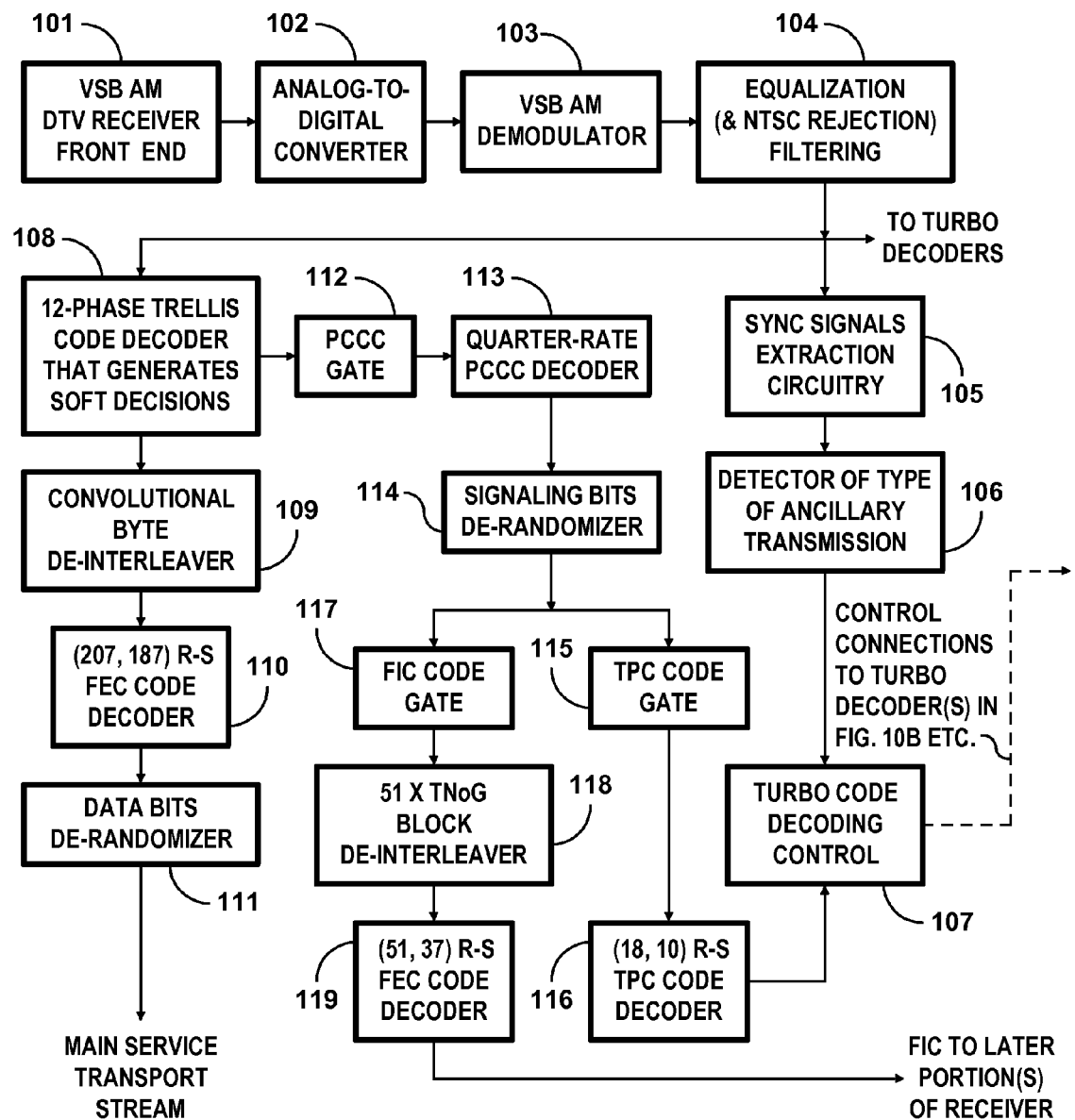
FIG. 10 is an assembly drawing showing how FIGS. 10A and 10B combine to provide a detailed schematic diagram of DTV receiver apparatus for receiving M/H transmissions sent over the air from the FIG. 1 DTV transmitter apparatus.
Figure 10B:
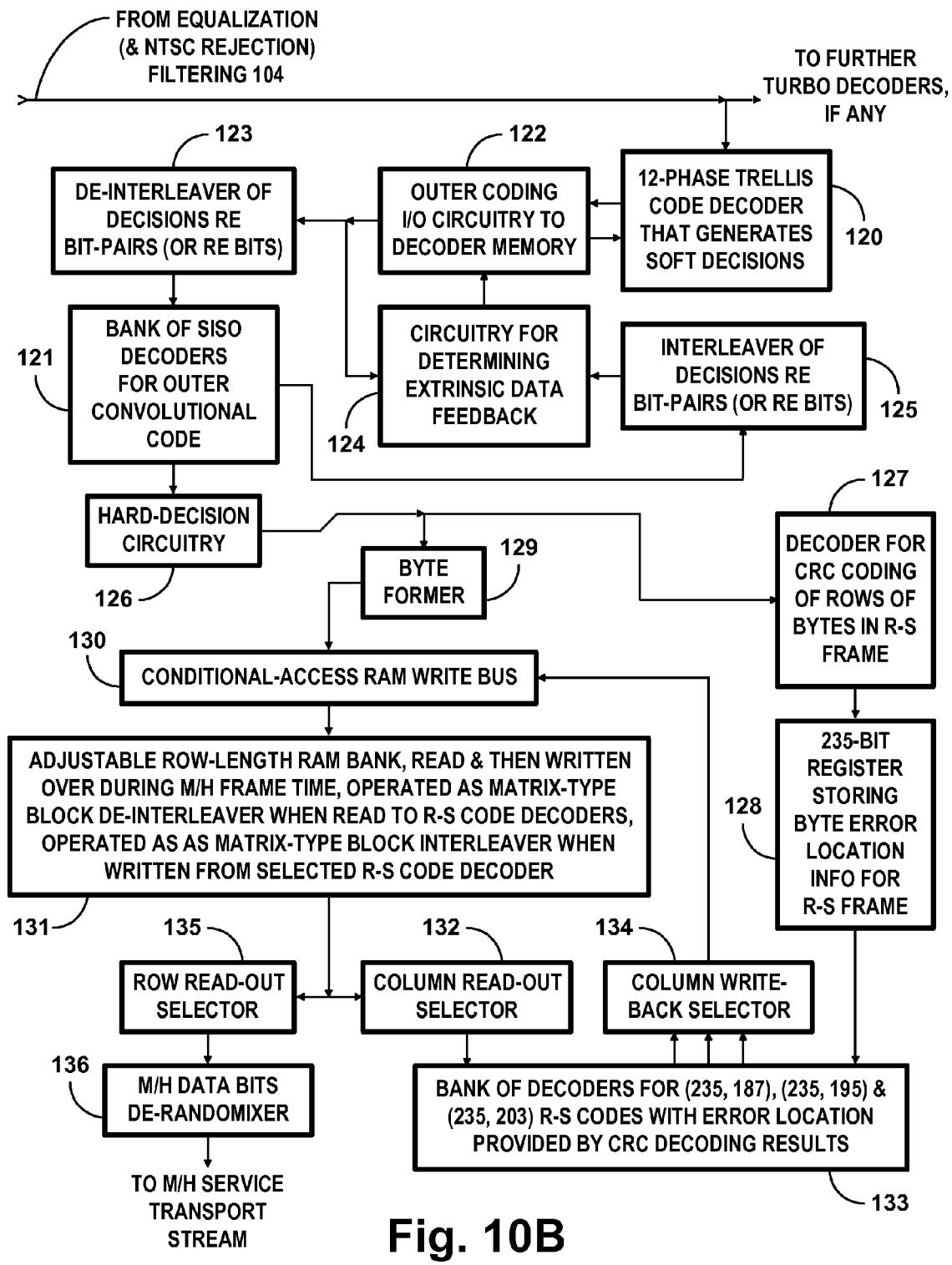

FIG. 10 is an assembly drawing that shows how FIGS. 10A and 10B combine to provide a detailed schematic diagram of DTV receiver apparatus for receiving M/H transmissions sent over the air from the FIG. 1 DTV transmitter apparatus. The FIG. 10A portion of the DTV receiver apparatus includes a vestigial-sideband amplitude-modulation (VSB AM) DTV receiver front-end 101 for selecting a radio-frequency DTV signal for reception, converting the selected RF DTV signal to an intermediate-frequency DTV signal, and for amplifying the IF DTV signal. An analog-to-digital converter 102 is connected for digitizing the amplified IF DTV signal supplied from the DTV receiver front-end 101. A demodulator 103 is connected for demodulating the digitized VSB AM IF DTV signal to generate a digitized baseband DTV signal, which is supplied to digital filtering 104 for equalization of channel response and for rejection of co-channel interfering NTSC signal. Synchronization signals extraction circuitry 105 is connected for receiving the digital filtering 104 response. Responsive to data-field-synchronization (DFS) signals, the sync extraction circuitry 105 detects the beginnings of data frames and fields. Responsive to data-segment-synchronization (DSS) signals, the sync extraction circuitry 105 detects the beginnings of data segments. The FIG. 10 DTV receiver apparatus uses the DSS and DFS signals for controlling its operations similarly to the way this is conventionally done in DTV receivers. Other portions of the sync extraction circuitry 105 synchronize the symbol clocking of the FIG. 10 receiver. Neither FIG. 10A nor FIG. 10B explicitly shows the circuitry for effecting these operations.

A decoder 106 for detecting the type of ancillary transmission responds to 8-bit sequences contained in final portions of the reserved portions of DFS signals separated by the sync extraction circuitry 105. The decoder 106 is connected for indicating the type of ancillary transmission to turbo decoding control circuitry 107 that controls turbo decoding in the FIG. 10 DTV receiver apparatus. The type of ancillary transmission that the decoder 106 detects may be one that conditions the decoder 106 to extract further information concerning the ancillary transmission from the initial portions of the reserved portions of DFS signals separated by the sync extraction circuitry 105. The decoder 106 is connected for supplying such further information to the turbo decoding control circuitry 107. For the most part the connections of the turbo decoding control circuitry 107 to the elements involved in decoding the SCCC are not explicitly shown in FIGS. 10A and 10B, so as to keep those figures from being too cluttered to be understood readily.

FIG. 10A shows a 12-phase trellis decoder 108 connected for receiving the digital filtering 104 response. The 12-phase trellis decoder 108 is connected for supplying trellis-decoding results to a byte de-interleaver 109. The byte de-interleaver 109 provides byte-by-byte de-interleaving of these results to generate input signal for a Reed-Solomon decoder 110 of the de-interleaved (207, 187) RS FEC codewords supplied from the byte de-interleaver 109. The de-interleaving performed by the byte de-interleaver 109 complements the convolutional byte interleaving prescribed by A/53, Annex D, §4.2.4. Preferably, the de-interleaved (207, 187) RS FEC codewords are accompanied by soft-decision information, and the RS decoder 110 is of a sort that can use the soft-decision information to improve overall performance of the decoders 108 and 110. The RS decoder 110 is connected for supplying packets of randomized hard-decision data to a data bits de-randomizer 111, which exclusive-ORs the bits of the randomized hard-decision data with respective bits from appropriate portions of the PRBS prescribed in A/53, Annex D, §4.2.2 to generate a first transport stream. This first transport stream is constituted in part of MPEG-2-compatible packets of de-randomized principal data. Insofar as the RS decoder 110 is capable, it corrects the hard-decision 187-byte randomized data packets that it supplies to the data bits de-randomizer 111. The output signal from the data bits de-randomizer 111 reproduces the main-service multiplex transport stream. Receiver apparatus designed for receiving M/H data transmissions exclusively will not include the byte de-interleaver 109, the RS decoder 110 and the data bits de-randomizer 111, of course.

FIG. 10A shows a PCCC gate 112 connected for extracting the PCCC'd signaling within each M/H Group and reproducing the PCCC'd signaling for application as input signal to a decoder 113 for quarter-rate PCCC. The decoder 113 reproduces randomized signaling decoded (possibly with some errors) from the quarter-rate PCCC supplied thereto and is connected for supplying that randomized signaling as input signal to a signaling bits de-randomizer 114. A TPC code gate 115 is connected for extracting the TPC code content from the randomized signaling and reproducing the TPC code content for application as input signal to a decoder 116 for (18, 10) Reed-Solomon coding. The decoder 116 recovers TPC information and is connected for supplying the TPC information to the turbo decoding control circuitry 107. An FIC code gate 117 is connected for extracting the byte-interleaved FIC code content from the randomized signaling and reproducing that extracted content for application as input signal to a block de-interleaver 118. The block de-interleaver 118 is of matrix type and complements the block interleaving done by the block interleaver 101 described supra with reference to FIG. 10. The block de-interleaver 118 is connected for supplying its de-interleaved FIC code response to a decoder 119 for (51, 37) Reed-Solomon coding as input signal thereto. The decoder 119 recovers FIC information and is connected for supplying the FIC information to a later portion or later portions of the receiver apparatus.

FIG. 10B shows a further 12-phase trellis decoder 120 connected for receiving the digital filtering 104 response. The trellis decoder 120 is further connected as a soft-input, soft-output (SISO) inner decoder in a turbo decoding loop that also includes a soft-input, soft-output (SISO) outer decoder within a bank 121 of SISO outer decoders. The turbo decoding procedures often involve iterations of both decoding of the inner convolutional code of the SCCC by the SISO trellis decoder 120 and decoding of the outer convolutional code of the SCCC by a selected one of a bank 121 of SISO outer decoders. The bank 121 of SISO outer decoders comprises decoders for one-half-rate, one-third-rate and one-quarter-rate outer convolutional coding. Only a selected one of these decoders is conditioned for current decoding by control signal received from the turbo decoding control circuitry 107 via a connection not explicitly shown in FIGS. 10A and 10B. The trellis decoder 120 includes memory for storing the digital filtering 104 response for updating by the extrinsic information. The decoding operations of the decoders 120 and 121 are staggered in time. The decoder 120 and the decoders in the bank 121 of them may be of types that use the soft-output Viterbi algorithm (SOVA) for evaluating code trellises, but preferably are of types that use the logarithmic maximum a posteriori algorithm (log-MAP) for such evaluations. In any case, the decoder 120 and the decoders in the bank 121 of them each comprise respective memory for temporary storage of the soft-decisions that they respectively generate.

Input/output circuitry 122 is used for accessing selected portions of the memory for temporary storage of soft-decisions in the trellis decoder 120 that contain soft-decisions related to the interleaved outer convolutional coding of the SCCC. This input/output circuitry 122 includes a memory address generator, the operation of which is controlled by the turbo code decoding control circuitry 107. Responsive to control by the turbo code decoding control circuitry 107, the input/output circuitry 122 reads soft-decisions related to the reproduced interleaved outer convolutional coding of the SCCC to the input port of a bit-pair de-interleaver 123. These soft-decisions are also supplied to a first input port of circuitry 124 for determining interleaved extrinsic information to be fed back for turbo decoding procedures. These soft-decisions are temporarily stored in the circuitry 124 for later comparison with the response of a bit-pair interleaver 125 supplied to a second input port of the circuitry 124.

The de-interleaver 123 is connected for de-interleaving the interleaved outer convolutional coding of the SCCC and supplying soft-decisions related to the de-interleaved outer convolutional coding to the selected one of the bank 121 of SISO outer decoders. The selected one of the bank 121 of SISO outer decoders is connected for supplying soft decisions concerning its decoding results to the bit-pair interleaver 125, which is complementary to the de-interleaver 123. The circuitry 124 compares the interleaved decoding results from the interleaver 125 with the temporarily stored trellis decoder 120 decoding result to generate extrinsic information. This extrinsic information is fed back through the input/output circuitry 122 to update the trellis-coded digital filtering 104 response that is temporarily stored in selected portions of the memory in the trellis decoder 120 that hold the Group or portion of a Group that is being turbo decoded.

FIG. 10B shows the bank 121 of SISO outer decoders connected for supplying soft decisions to hard-decision circuitry 126 that generates hard decisions responsive to the soft decisions supplied thereto. The hard-decision circuitry 126 is connected for supplying its response to a decoder 127 of 16-bit cyclic-redundancy-check (CRC) coding. The CRC decoder 127 detects whether or not an expected checksum occurs at the conclusion of a row of a prescribed number of bytes generating a ZERO when the 16-bit checksum has its expected value and a ONE when that checksum has a different value. A 235-bit shift register 128 connected in ring is used for storing the checksum results for the first RS Frame, as generated by the CRC decoder 127.

The hard-decision circuitry 126 is connected for supplying its response to a byte former 129 and thence to a conditional-access write bus 130 for an adjustable row-length random-access memory bank 131. After 235 rows of bytes formed from hard decisions concerning the M/H Frame generated by the hard-decision circuitry 126 have been written into the RAM bank 135, TRS decoding procedures begin. In turn each 235-byte column of bytes stored in the RAM bank 131 is read to be error corrected. After error correction the data bytes in that column are written back to their original storage locations before reading of the next 235-byte column of bytes stored in the RAM bank 131. A column read-out selector 132 is conditioned to reproduce each column read-out from the RAM bank 131 for application to a bank 133 of Reed-Solomon decoders. The bank 133 of RS decoders includes decoders for a (235, 187) RS code, a (235, 195) RS code, and a (235, 203) RS code. The appropriate RS decoder in the bank 133 of RS decoders is selected in response to the two bit RS code mode transmitted amongst the TPC data. At least the selected RS decoder receives the 235-byte RS codeword read from each column in the RAM bank 131 together with corresponding CRC checksum indications from the 235-bit shift register 128. These CRC checksum indications are used for locating possible byte errors in each 235-byte RS codeword to improve, if necessary, the capability of the selected RS decoder to correct byte errors. A column write-back selector 134 is conditioned to reproduce the data bytes from the selected RS decoder in the bank 133 for application to the conditional-access write bus 130 for the RAM bank 131. Subsequently, these data bytes are re-written to their original storage locations within the RAM bank 131. When all the data bytes temporarily stored within the RAM bank 131 have been subjected to TRS decoding and byte-error correction where possible, the data bytes in successive rows of the RAM bank 131 are each read out. After each data byte is read it is over-written by a corresponding byte of the next M/H Frame supplied in response to hard decisions from the circuitry 126.

A row read-out selector 135 is conditioned to reproduce each row read-out from the RAM bank 131 for application to an M/H data bits de-randomizer 136 as input signal thereto. The M/H data bits de-randomizer 136 is connected to supply its de-randomized M/H data response as a part of the reproduced M/H-service transport stream.

Figure 11:
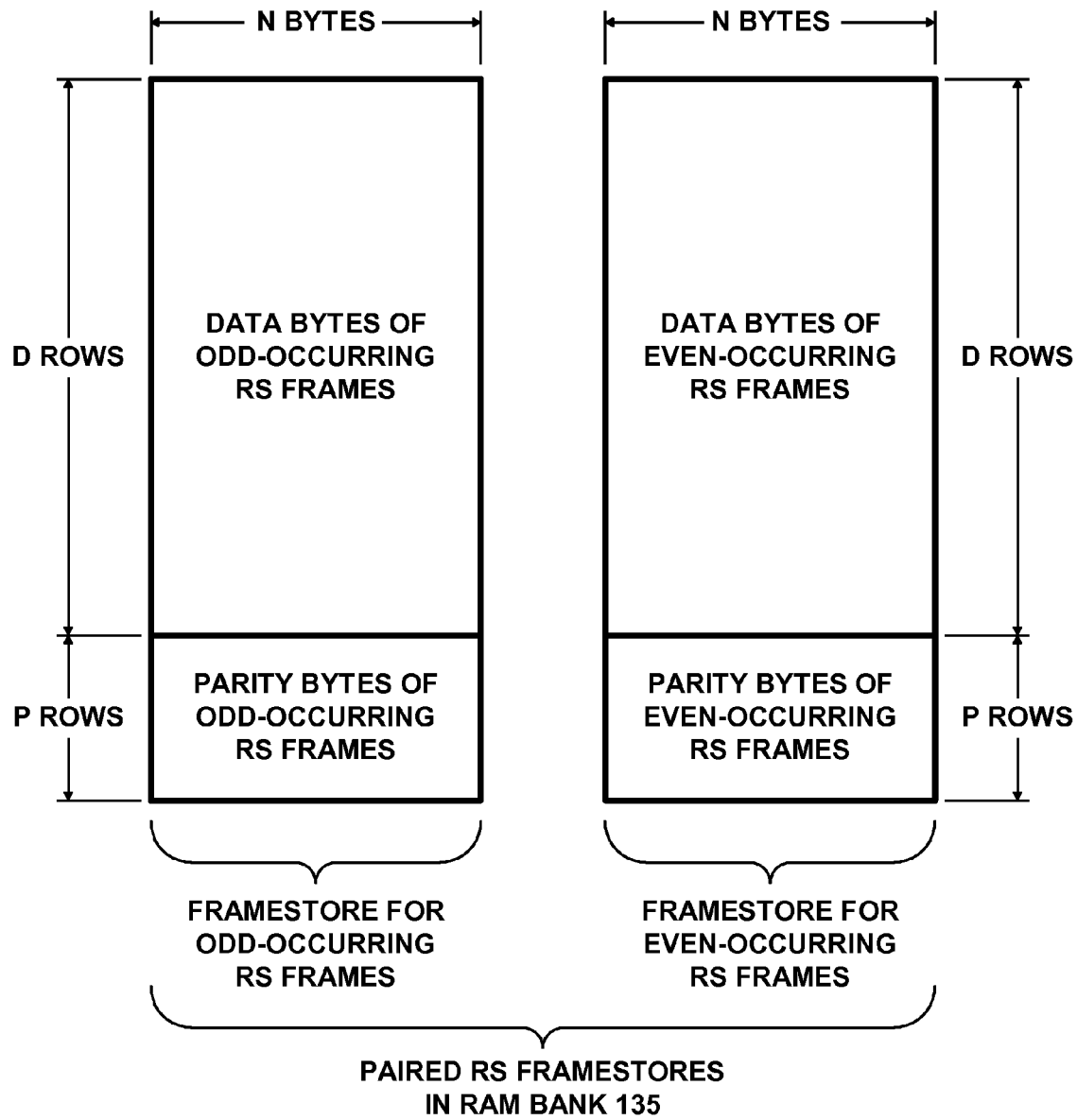
FIG. 11 is a diagram of a storage scheme used in the bank of random-access memory shown in FIG. 10B when systematic TRS coding is being decoded.

FIG. 11 shows a storage scheme used in the bank 131 of RAM shown in FIG. 10B when the receiver is designed for receiving M/H transmissions employing systematic TRS codes. In this storage scheme the bank 131 of RAM comprises a respective pair of byte-organized framestores of similar size for storing odd-occurring and even-occurring RS Frames, respectively, for a particular M/H service. The rows of byte-storage locations in each of these framestores shown uppermost in FIG. 11 store M/H data bytes from the earlier-decoded part of an RS Frame and are D in number. The rows of byte-storage locations in each of these framestores shown lowermost in FIG. 11 store parity bytes from the later-decoded part of the RS Frame and are P in number. The total number of rows of byte-storage in each of these framestores is (D+P)=235. The number N of byte-storage locations in each row is two less than the number of Groups per M/H Frame for the particular M/H service times the number of columns of 235 bytes per Group for the type of RS Frame.

The contents of the rows of byte-storage locations in the leftmost framestore of FIG. 11 are read and then written over during odd-occurring RS Frames. During this time the contents of successive columns of byte-storage locations in the rightmost framestore of FIG. 11 are read for TRS decoding and written over with bytes from the TRS decoding. The reading and writing over of the rows of byte-storage locations in the leftmost framestore progresses from the uppermost row to the lowermost row.

The contents of the rows of byte-storage locations in the rightmost framestore of FIG. 11 are read and then written over during even-occurring RS Frames. During this time the contents of successive columns of byte-storage locations in the leftmost framestore of FIG. 11 are read for TRS decoding and written over with bytes from the TRS decoding. The reading and writing over of the rows of byte-storage locations in the rightmost framestore progresses from the uppermost row to the lowermost row.

Figure 12:
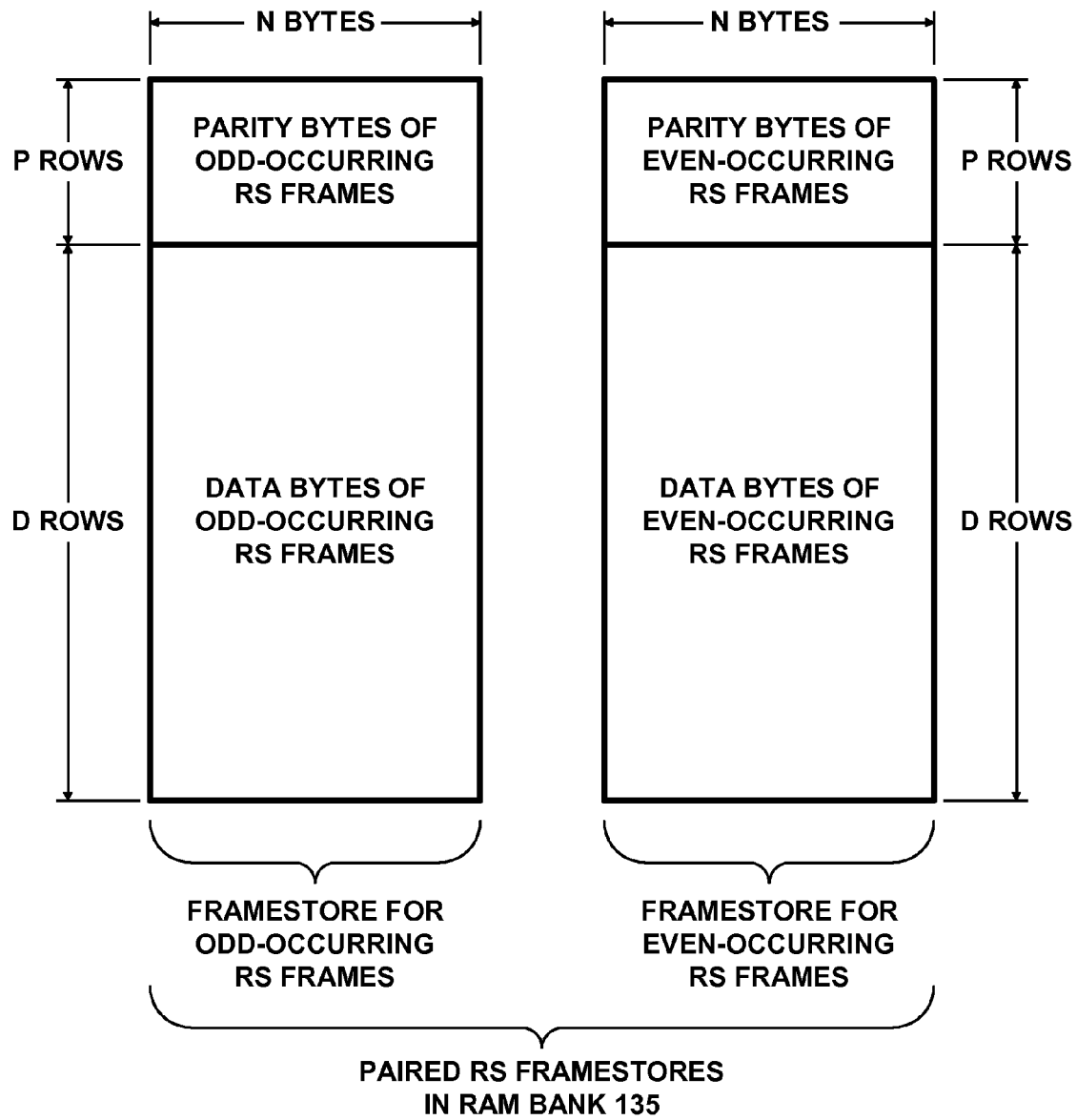
FIG. 12 is a diagram of a storage scheme used in the bank of random-access memory shown in FIG. 10B when non-systematic TRS coding is being decoded.

FIG. 12 shows a variation of the FIG. 11 storage scheme. This FIG. 12 storage scheme is one used in the bank 131 of RAM shown in FIG. 10B when the receiver is designed for receiving M/H transmissions employing systematic TRS codes. In the FIG. 12 storage scheme the bank 131 of RAM comprises a respective pair of byte-organized framestores of similar size for storing odd-occurring and even-occurring RS Frames, respectively, for a particular M/H service. The rows of byte-storage locations in each of these framestores shown uppermost in FIG. 12 store parity bytes from the earlier-decoded part of an RS Frame and are D in number. The rows of byte-storage locations in each of these framestores shown lowermost in FIG. 12 store M/H data bytes from the later-decoded part of the RS Frame and are P in number. The total number of rows of byte-storage in each of these framestores is (D+P)=235. The number N of byte-storage locations in each row is two less than the number of Groups per M/H Frame for the particular M/H service times the number of columns of 235 bytes per Group for the type of RS Frame.

The contents of the rows of byte-storage locations in the leftmost framestore of FIG. 12 are read and then written over during odd-occurring RS Frames. During this time the contents of successive columns of byte-storage locations in the rightmost framestore of FIG. 12 are read for TRS decoding and written over with bytes from the TRS decoding. The reading and writing over of the rows of byte-storage locations in the leftmost framestore progresses from the uppermost row to the lowermost row.

The contents of the rows of byte-storage locations in the rightmost framestore of FIG. 12 are read and then written over during even-occurring RS Frames. During this time the contents of successive columns of byte-storage locations in the leftmost framestore of FIG. 12 are read for TRS decoding and written over with bytes from the TRS decoding. The reading and writing over of the rows of byte-storage locations in the rightmost framestore progresses from the uppermost row to the lowermost row.

The storage schemes of FIGS. 11 and 12 require the M/H receiver to have RS storage capacity for two complete M/H Frames. The operational advantage of the storage schemes of FIGS. 11 and 12 is that each framestore has a complete M/H Frame interval to perform TRS decoding procedures. TRS decoding procedures and the memory operation in support thereof can be relatively slow, which conserves power consumption.

Figure 13:
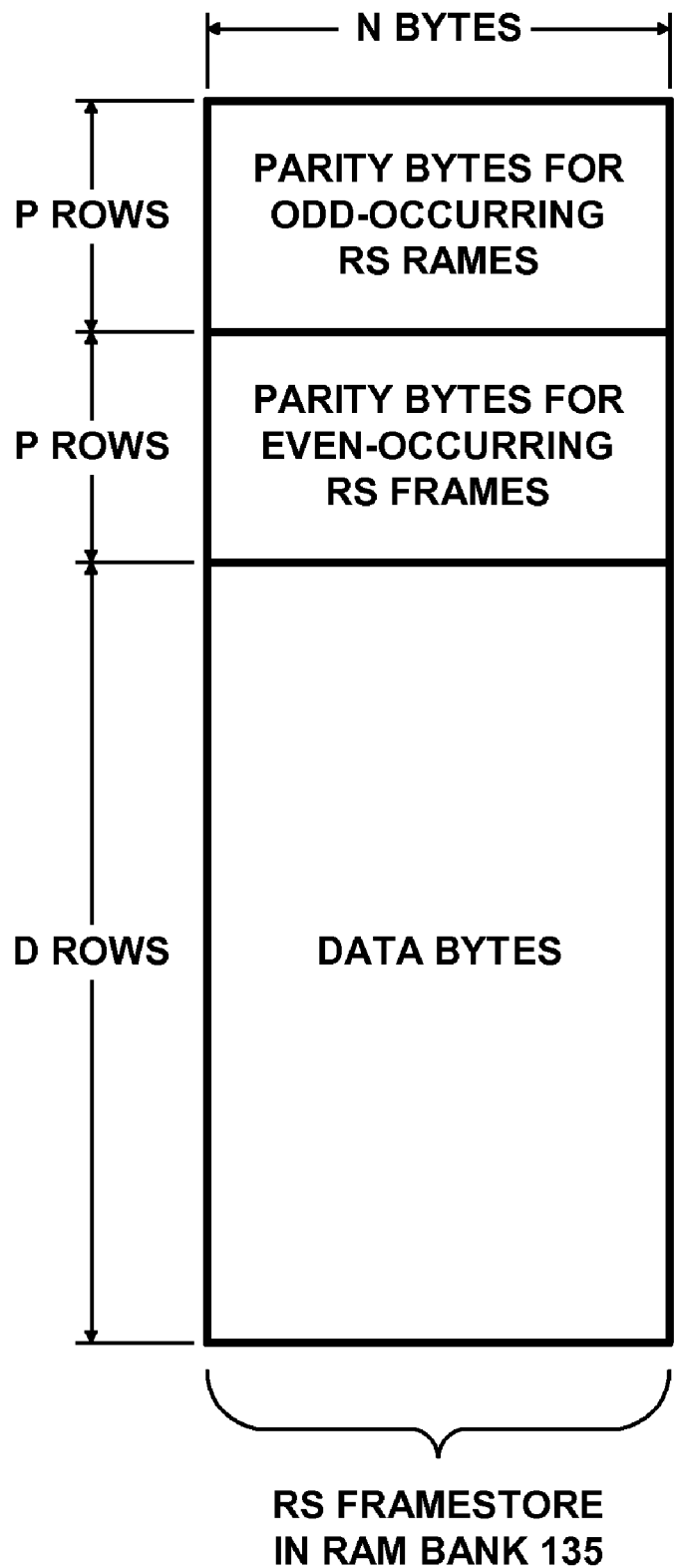
FIG. 13 is a diagram of an alternative storage scheme for use in the bank of random-access memory shown in FIG. 10B when non-systematic TRS coding is being decoded, which storage scheme requires less memory than the storage scheme diagrammed in FIG. 12.

FIG. 13 is a diagram of an alternative storage scheme for use in the bank 131 of RAM shown in FIG. 10B, which alternative storage scheme does not require as much RS storage capacity as the FIG. 11 storage scheme. The FIG. 13 storage scheme depends, however, on the TRS parity bytes being transmitted prior to the data bytes of the RS Frame. The FIG. 13 storage scheme requires RS storage capacity for (1+P/D) complete M/H Frames, P being the number of parity bytes in each TRS codeword and D the number of data bytes. That is, the RS storage capacity required is somewhat more than 6/5 of a complete M/H Frame, presuming the largest value P to be 48. When the FIG. 13 storage scheme is used in the bank 131 of RAM, each RS-Frame-storage RAM is operated with D rows of byte storage locations for M/H Frame data. Additionally, each of them is operated with P rows of byte storage locations for TRS parity in odd-occurring M/H Frames, and an additional P rows of byte storage locations for TRS parity in even-occurring M/H Frames.

The parity-byte contents of the uppermost P rows of parity-byte-storage locations are written-over by TRS parity bytes at the beginning of each odd-occurring M/H Frame. During this time the contents of successive columns of byte-storage locations in the final (P+D) rows of byte-storage locations of the RS-Frame-storage RAM are read to a TRS decoder, and the corrected data bytes are then written back to their original byte-storage locations in the final D rows of the RS-Frame-storage RAM. The data bytes that have gone through this TRS decoding and correction procedure are those from the preceding even-occurring M/H Frame. Then, at the conclusion of each odd-occurring M/H Frame, the corrected-data-byte contents of the final D rows of byte-storage locations are read before written-over by new data bytes of the odd-occurring M/H Frame.

The parity-byte contents of the lowermost P rows of parity-byte-storage locations are written-over by TRS parity bytes at the beginning of each even-occurring M/H Frame. During this time the contents of successive columns of byte-storage locations in the initial P rows and final D rows of byte-storage locations are read to a TRS decoder, and the corrected data bytes are then written back to their original byte-storage locations in the final D rows of the RS-Frame-storage RAM. The data bytes that have gone through this TRS decoding and correction procedure are those from the preceding odd-occurring M/H Frame. Then, at the conclusion of each even-occurring M/H Frame, the corrected-data-byte contents of the final D rows of byte-storage locations are read before written-over by new data bytes of the even-occurring M/H Frame.

The time available for performing a complete TRS decoding operation on an M/H Frame when the bank 131 of RAM employs the FIG. 13 storage scheme is considerably shorter than an M/H Frame interval. The time is P/(P+D) times an M/H Frame interval. The time is 0.21 times an M/H Frame interval if P is 48 and (P+D) is 235. The time is shortened to 0.170 times an M/H Frame interval if P is 40 and (P+D) is 235. The time is further shortened to 0.136 times an M/H Frame interval if P is 32 and (P+D) is 235. When a sole RS Frame is used, an RS-Frame-storage RAM in the bank 131 of RAM may be configured to receive outer convolutional coding results from as many 40 M/H Groups per M/H Frame. If the outer convolutional coding only halves code rate, which condition places the greatest speed requirement on TRS decoding, there are 40 columns of bytes per M/H Group and 235 bytes per column. Two of the columns of 235 bytes consist of checksums for the CRC coding.

If P is 48, then 187 bytes per column return from the TRS decoder to write-over the data bytes temporarily stored in the RS-Frame-storage RAM. The TRS decoding operation uses up (235+187) clock intervals for each of the 1598 columns of bytes in a RS-Frame-storage RAM in the bank 131 of RAM—that is, some 674,356 clock intervals in the 968 millisecond M/H Frame interval. This means that the clock rate has to be somewhat higher than 675,200 clock intervals per second for the FIG. 12 storage scheme, if allowances are made for the checksums of the CRC coding and for latent delay in the RS coding operation. If the FIG. 13 storage scheme is used instead, the TRS decoding operation has to be speeded up 235/48 times, so the clock rate has to be somewhat higher than 3,305,667 clock intervals per second.

If P is 40, then 195 bytes per column return from the TRS decoder to write-over the data bytes temporarily stored in a RS-Frame-storage RAM within the bank 131 of RAM. The TRS decoding operation uses up (235+195) clock intervals for each of the 1598 columns of bytes in a component RAM in the bank 131 of RAM—that is, some 687,140 clock intervals in the 968 millisecond M/H Frame interval. This means that the clock rate has to be somewhat higher than 688,000 clock intervals per second for the FIG. 12 storage scheme, if allowances are made for the checksums of the CRC coding and for latent delay in the RS coding operation. If the FIG. 13 storage scheme is used instead, the TRS decoding operation has to be speeded up 235/40 times, so the clock rate has to be somewhat higher than 4,042,000 clock intervals per second.

If P is 32, then 203 bytes per column return from the TRS decoder to write-over the data bytes temporarily stored in the bank 131 of RAM. The TRS decoding operation uses up (235+203) clock intervals for each of the 1598 columns of bytes in a RS-Frame-storage RAM within in the bank 131 of RAM—that is, some 699,9249 clock intervals in the 968 millisecond M/H Frame interval. This means that the clock rate has to be somewhat higher than 700,800 clock intervals per second for the FIG. 12 storage scheme, if allowances are made for the checksums of the CRC coding and for latent delay in the RS coding operation. If the FIG. 13 storage scheme is used instead, the TRS decoding operation has to be speeded up 235/32 times, so the clock rate has to be somewhat higher than 5,146,500 clock intervals per second. This is about half the symbol clock rate for 8VSB, so should be in the range of practicality for the integrated-circuit technology chosen to implement the M/H receiver.

Figure 15:
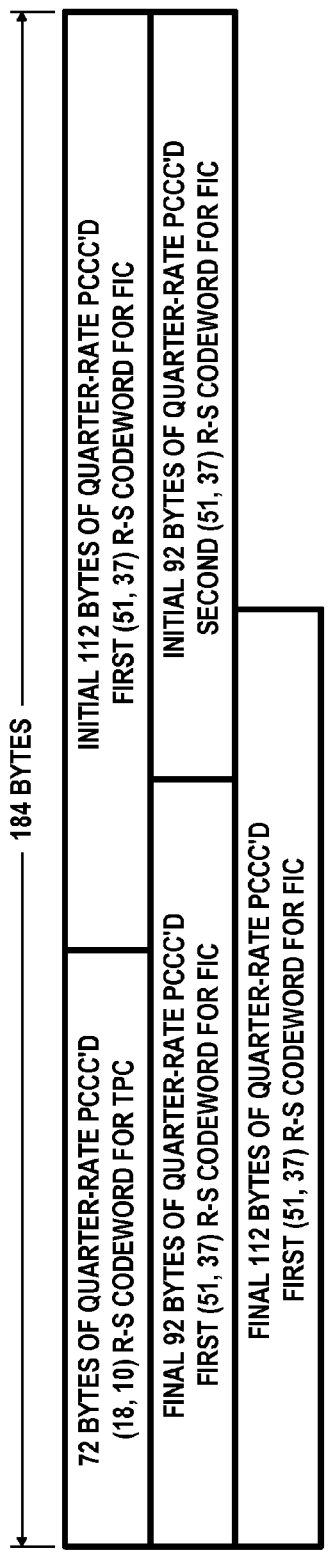
FIG. 15 is a diagram showing how the FIG. 14 DTV transmitter apparatus fits extended FIC Chunks into each M/H Group in accordance with an aspect of the invention.

FIG. 15 is a schematic diagram of modified FIG. 1 DTV transmitter apparatus, wherein the signaling encoder 9 that uses FIC-Chunks is replaced by a signaling encoder 90 per FIG. 17. The signaling encoder 90 generates extended FIC-Chunks with twice as many bytes as FIC Chunks, with a respective pair of FIC-Segments being transmitted in each M/H Group. The modified FIG. 1 DTV transmitter apparatus shown in FIG. 15 replaces the Group formatter 8 with a Group formatter 80 that constructs M/H Groups using TPC codes and extended FIC-Chunks generated by the signaling encoder 90 per FIG. 17. The modified FIG. 1 DTV transmitter apparatus shown in FIG. 15 replaces the packet formatter 10 with a packet formatter 100 that accommodates the Group formatter 8 replacing some dummy bytes in each M/H Group with M/H data bytes.

Figure 14:
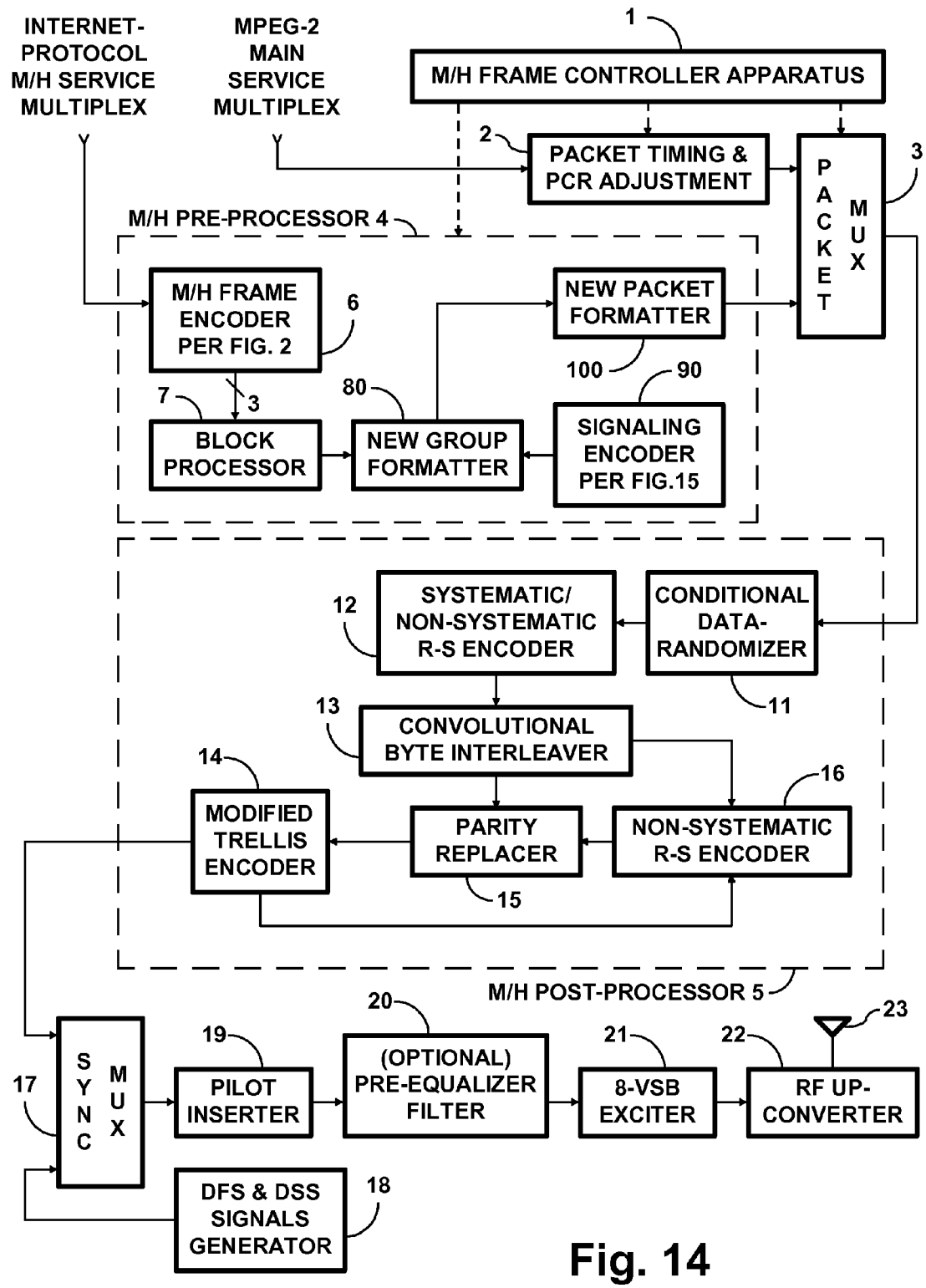
FIG. 14 is a schematic diagram of modified FIG. 1 DTV transmitter apparatus, which modified DTV transmitter apparatus embodies an aspect of the invention that concerns doubling the amount of FIC information conveyed in each M/H Group.

FIG. 14 depicts the signaling area that the signaling encoder 90 in the FIG. 13 DTV transmitter apparatus generates for the Group formatter 8 to introduce into the Group format, as considered following convolutional byte interleaving. The signaling encoder in the M/H transmission system as described in A/153 uses one-quarter-rate PCCC to encode an (18, 10) RS codeword followed by a (51, 37) RS codeword. The (18, 10) RS codeword is the foundation of a Transmission Parameter Channel (TPC). The (51, 37) RS codeword is the foundation of a Fast Information Channel (FIC). When quarter-rate PCCC'd, this signaling takes up 276 bytes or 1.5 payload data fields of MHE packets. FIG. 14 shows the result of using two (51, 37) RS codewords per MH Group as the foundation of the FIC, rather than using just one (51, 37) RS codeword per M/HGroup. This is done to provide for the transmission of extended FIC-Chunks that contain twice as many 37-byte FIC-Segments as the FIC-Chunks originally proposed by LG Electronics, with on average two FIC-Segments being transmitted in each M/H Group. As before, the initial 184 bytes of signaling will correspond to the payload data field in the 17th or the 173rd segment of an 8VSB data field. Rather than only half the payload data field of the succeeding segment of the 8VSB data field being occupied by further signaling, the entire payload data field of the succeeding segment of the 8VSB data field will be occupied as well as 112 more bytes in the next succeeding segment of the 8VSB data field. This reduces the number of bytes available in a Group for coded M/H data from 19,248 to just 19,044.

FIG. 15 is a detailed schematic diagram of the signaling encoder 90 in the FIG. 13 DTV transmitter apparatus. The signaling encoder 90 comprises an encoder 91 for (18, 10) Reed-Solomon coding TPC bits and an encoder 92 for (51, 37) Reed-Solomon coding FIC bytes. In a departure from previous practice the encoder 92 encodes seventy-four rather than just thirty-seven bytes per Group. The encoder 92 is connected for supplying the resulting 102 bytes of RS-coded FIC to a matrix-type block interleaver 93 twice as large as used in the prior-art M/H system. A time-division multiplexer 94 is connected for supplying a response that interleaves 102 bytes of block interleaver 93 response as received at a first input port of the multiplexer 94 between each 18-byte RS codeword received from the encoder 91 at a second input of the multiplexer 94. The multiplexer 94 is connected for supplying its response to a signaling randomizer 95 that is the same as the randomizer for M/H data. The signaling randomizer 95 is connected for supplying its response as input signal to a quarter-rate PCCC encoder 96, which is in turn connected to supply the quarter-rate PCCC that it generates to the Group formatter 8.

The signaling encoder 90 differs from that used in the prior-art M/H system with regard to the block interleaver 93. The block interleaver 93 has 102 (rather than just 51) columns of bytes, each column consisting of TNoG bytes, where TNoG is the total number of Groups (of all Parades) in the current Sub-Frame. The incoming RS coded FIC information is written into the block interleaver 93 row by row from top to bottom, proceeding from left to right along each row. The FIC information stored in the block interleaver 93 is read column by column from left to right, proceeding from top to bottom in each column, and supplied to the first input port of the multiplexer 94.

In the M/H transmission system specified by A/153, each M/H Group is considered to be partitioned into ten successive M/H blocks B1, B2, B3, B4, B5, B6, B7, B8, B9 and B10, each spanning sixteen consecutive 8VSB data segments. Each M/H Group is considered to be composed of four regions A, B, C and D. Region A consists of blocks B4, B5, B6 and B7. Region B consists of blocks B3 and B8. Region C consists of blocks B2 and B9. Region D consists of blocks B1 and B10. If the RS Frame mode of a Parade is specified as "01", indicating the Parade is transmitted as two separate RS Frames, the primary RS Frame is transmitted in Regions A and B of Groups, and the secondary RS Frame is transmitted in Regions C and D of M/H Groups. Regions A and B of an A/153 Group contain 15,288 byte epochs available for TRS-coded and CRC-coded randomized M/H data. Regions C and D of an A/153 Group contain 3,960 byte epochs available for TRS-coded and CRC-coded randomized M/H data. If the FIC were doubled in size, there would be 204 bytes fewer in M/H Block B2 or Region C of each M/H Group. Together, then, regions C and D of an M/H Group would contain only 3,756 byte epochs available for TRS-coded and CRC-coded randomized M/H data.

In the M/H transmission system specified in A/153, each M/H Group has a total of 19,248 byte epochs available for TRS-coded and CRC-coded randomized M/H data. If the RS Frame mode of a Parade is specified as "00", indicating the Parade is transmitted as a sole RS Frame, the sole RS Frame being transmitted in Regions A, B, C and D of Groups, using all 19,248 byte epochs available in each of those Groups for TRS-coded and CRC-coded randomized M/H data. The PCCC'd TPC occupied 72 byte epochs per Group, and the PCCC'd FIC occupied 204 byte epochs per Group. If the FIC is doubled in size, however, the total number of byte epochs per Group available for TRS-coded and CRC-coded randomized M/H data would be reduced by 204 to 19,044 byte epochs per Group.

If the outer convolutional coding reduced code rate by a factor of four, there would be 19,044÷4=4,761 byte epochs available in a Group for conveying a sole RS Frame. If the outer convolutional coding reduced code rate by a factor of three, there would be 19,044÷3=6,348 byte epochs available in a Group for conveying a sole RS Frame. If the outer convolutional coding reduced code rate by a factor of two, there would be 19,044÷2=9,522 byte epochs available in a Group for conveying a sole RS Frame. A 235-byte TRS code length fits 20 times into 4761 byte epochs with sixty-one bytes left over, fits 27 times into 6348 byte epochs with three bytes left over, and fits 40 times into 9522 byte epochs with 122 bytes left over.

Insofar as a primary RS Frame is concerned, doubling the size of FIC would reduce to just 15,084 the number of byte epochs per Group that are available for TRS-coded and CRC-coded randomized M/H data. If the outer convolutional coding reduced code rate by a factor of four, there would be 15,084÷4=3,771 byte epochs available in a Group for conveying a primary RS Frame. If the outer convolutional coding reduced code rate by a factor of three, there would be 15,084÷3=5,028 byte epochs available in a Group for conveying a primary RS Frame. If the outer convolutional coding reduced code rate by a factor of two, there would be 15,084÷2=7,542 byte epochs available in a Group for conveying a primary RS Frame. A 235-byte TRS code length fits 16 times into 3771 byte epochs with eleven bytes left over, fits 21 times into 5028 byte epochs with 93 bytes left over, and fits 32 times into 7542 byte epochs with 22 bytes left over.

Insofar as a secondary RS Frame is concerned, the 3960 bytes per Group that are available for TRS-coded and CRC-coded randomized M/H data remains unchanged despite the increase in the amount of coded signaling. If the outer convolutional coding reduced code rate by a factor of four, there would be 3,960÷4=990 byte epochs available in a Group for conveying a primary RS Frame. If the outer convolutional coding reduced code rate by a factor of three, there would be 3,960÷3=1,320 byte epochs available in a Group for conveying a primary RS Frame. If the outer convolutional coding reduced code rate by a factor of two, there would be 3,960÷2=1,980 byte epochs available in a Group for conveying a primary RS Frame. A 235-byte TRS code length fits four times into 990 byte epochs with 50 bytes left over, fits five times into 1320 byte epochs with 145 bytes left over, and fits eight times into 1980 byte epochs with 100 bytes left over.

Figure 17A:
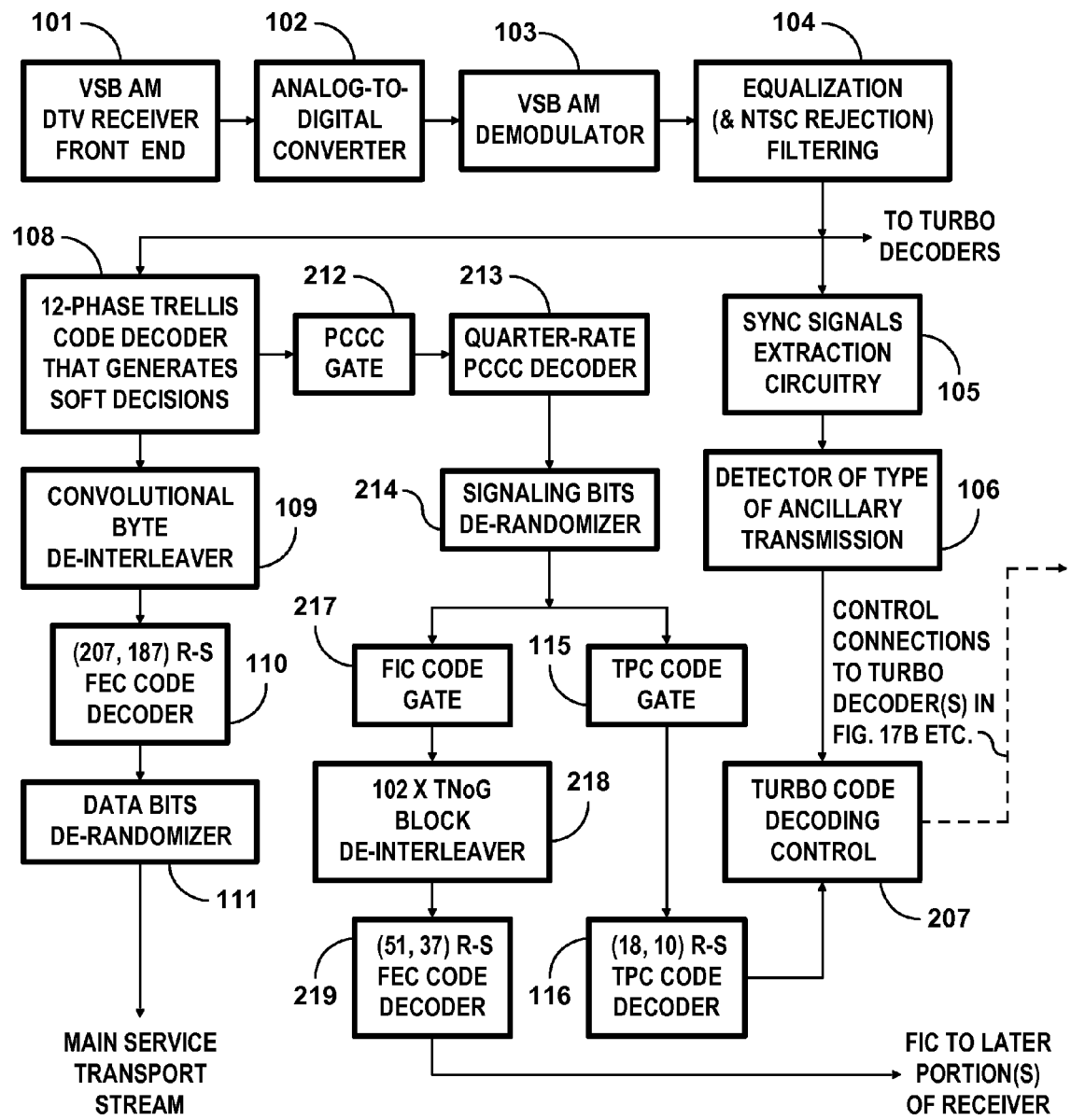
FIG. 17 is an assembly drawing showing how FIGS. 17A and 17B combine to provide a detailed schematic diagram of DTV receiver apparatus for receiving M/H transmissions sent over the air from the FIG. 14 DTV transmitter apparatus.
Figure 17B:
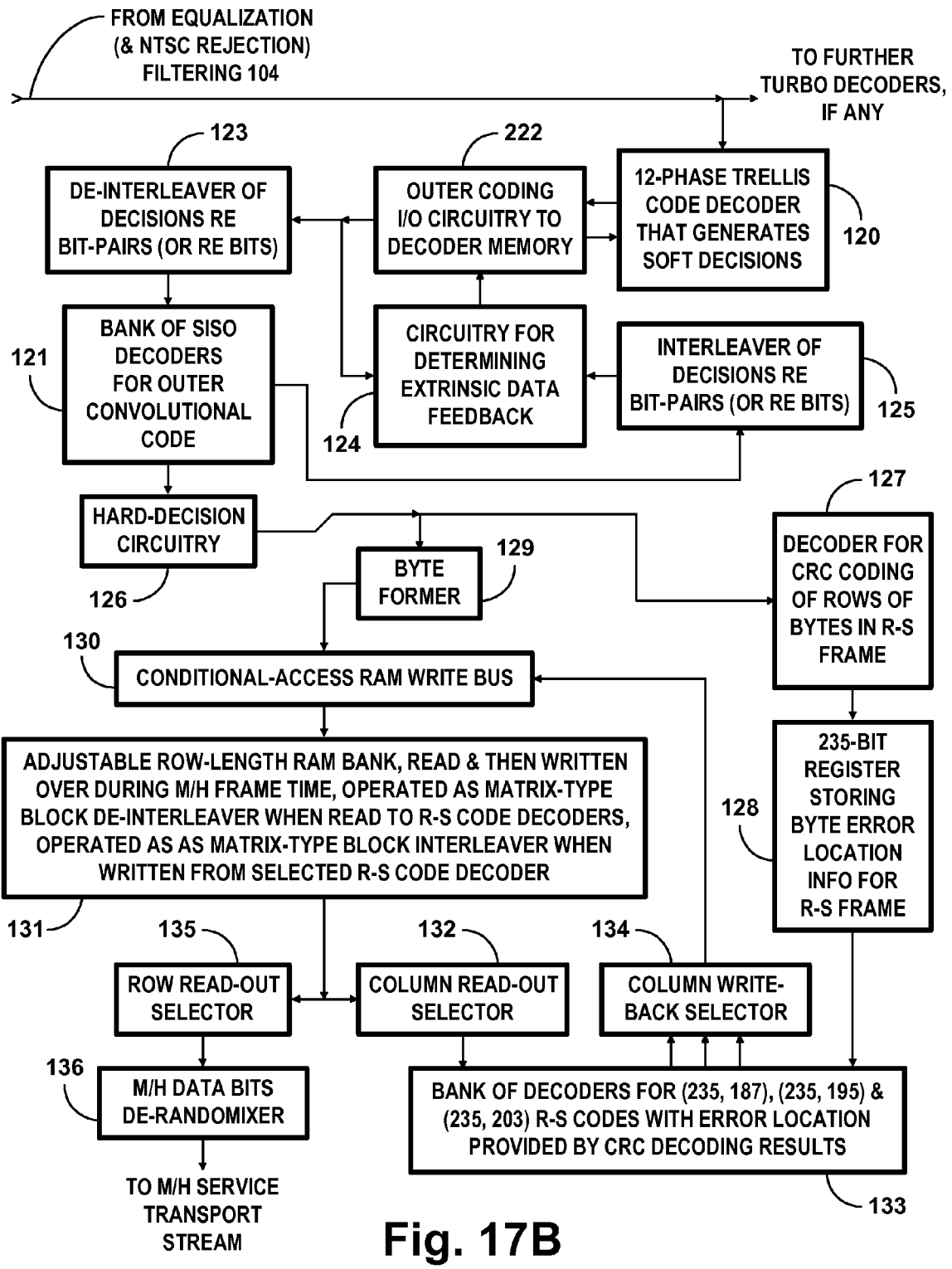

FIG. 17 is an assembly drawing showing how FIGS. 17A and 17B combine to provide a detailed schematic diagram of DTV receiver apparatus for receiving M/H transmissions sent over the air from the FIG. 14 DTV transmitter apparatus. The FIG. 17A portion of the FIG. 17 DTV receiver apparatus is similar to the FIG. 10A portion of the FIG. 10 DTV receiver apparatus, except in the following respects. The portions of the FIG. 17 DTV receiver apparatus having to do with the decoding of TPC and FIC signaling differ from the portions of the FIG. 10 DTV receiver apparatus having to do with the decoding of TPC and FIC signaling. The PCCC gate 112, the decoder 113 for quarter-rate PCCC, and the signaling bits de-randomizer 114 are replaced by a PCCC gate 212, a decoder 213 for quarter-rate PCCC, and a signaling bits de-randomizer 214, respectively. The replacement elements 212, 213 and 214 accommodate the extended PCCC coding of the TPC and FIC components of each M/H Group. The turbo code decoding control circuitry 107 is replaced by turbo code decoding control circuitry 207 that responds to DFS, DSS and TPC signals to control the turbo decoding procedures and attendant procedures in somewhat different way. The turbo code decoding control circuitry 207 supplies respective control signals to the PCCC gate 212, the decoder 213 for quarter-rate PCCC, and the signaling de-randomizer 214 to accommodate the extended PCCC coding of the TPC and FIC components of each M/H Group.

FIG. 17A does not explicitly show the connections for applying these control signals, and shows the turbo code decoding control circuitry 207 as being centralized in nature. In actual practice portions of the turbo code decoding control circuitry 207 (and the turbo code decoding control circuitry 107) may be dispersed amongst several locations in the receiver apparatus, which is usually constructed on an integrated circuit chip. The application of control signals is apt to be done by portions of the turbo code decoding control circuitry 207 located close to the elements subject to control by those control signals, those portions typically involving decoders for specific ranges of count from a master counter of symbol clock intervals.

Figure 16:
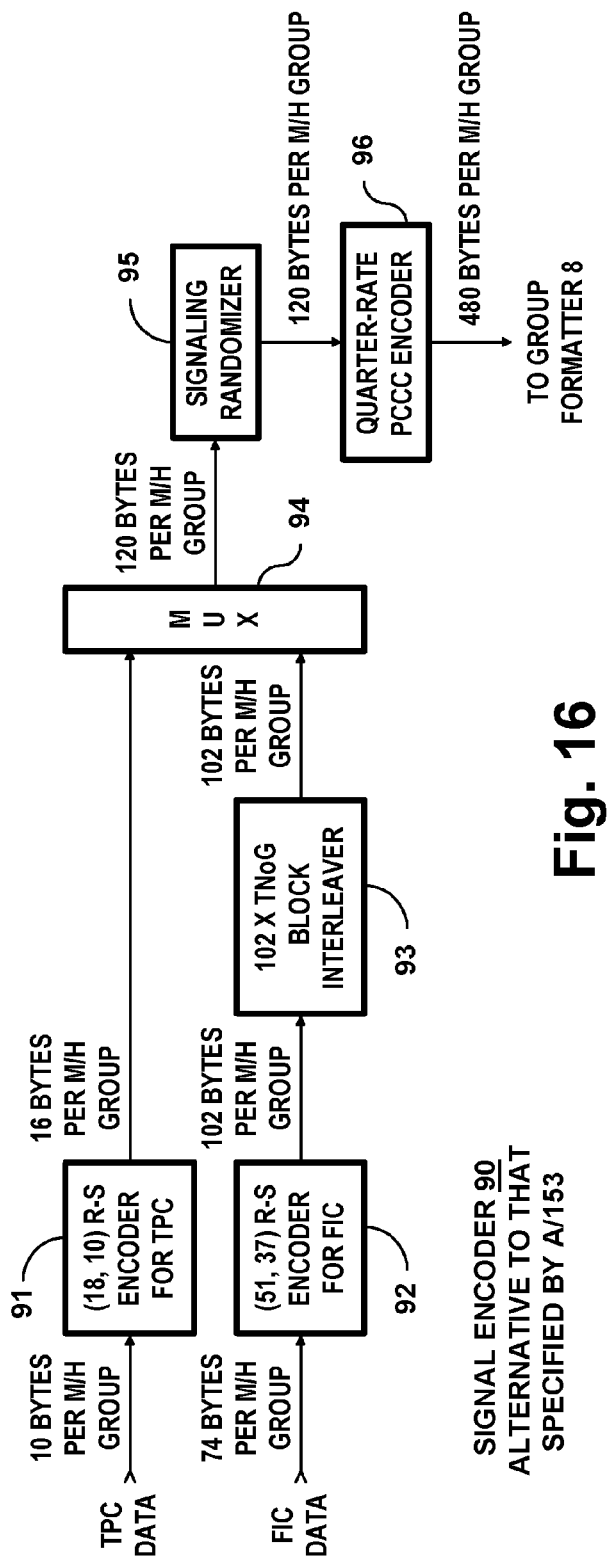
FIG. 16 is a detailed schematic diagram of an alternative signaling encoder that the FIG. 14 DTV transmitter apparatus includes as part of its modification from the FIG. 1 DTV transmitter apparatus.

The TPC code gate 115 and the decoder 116 for (18, 10) Reed-Solomon coding are connected for receiving respective control signals from the turbo code decoding control circuitry 207 via connections not explicitly shown in FIG. 17A. The TPC code gate 115 is connected for extracting the TPC code content from the randomized signaling from the output signal of the signaling bits de-randomizer 114 and reproducing the TPC code content for application as input signal to the decoder 116 for (18, 10) Reed-Solomon coding. The decoder 116 recovers TPC information and is connected for supplying the TPC information to the turbo decoding control circuitry 207. An FIC code gate 217 replaces the FIC code gate 117 and is connected for receiving control signal from the turbo decoding control circuitry 207 via a connection not explicitly shown in FIG. 17A. This control signal conditions the FIC code gate 217 for extracting 408-byte sequences of byte-interleaved FIC code content from the output signal of the signaling bits de-randomizer 214 and reproducing that extracted content for application as input signal to a block de-interleaver 218. The block de-interleaver 218 is of matrix type and complements the block interleaving done by the block interleaver 93 described supra with reference to FIG. 16. The block de-interleaver 218 is connected for supplying its de-interleaved FIC code response to a decoder 219 for (51, 37) Reed-Solomon coding as input signal thereto. The decoder 219 recovers FIC information and is connected for supplying the FIC information to a later portion or later portions of the receiver apparatus.

The FIG. 17B portion of the FIG. 17 DTV receiver apparatus is similar to the FIG. 10B portion of the FIG. 10 DTV receiver apparatus, except in the following respect. The outer coding I/O circuitry 122 of the FIG. 10B receiver apparatus is replaced by outer coding input/output circuitry 222 in the FIG. 17B receiver apparatus. The outer coding I/O circuitry 222 selects the bit-pair-interleaved (or bit-interleaved) outer convolutional coding from the results of the decoder 120 decoding the 12-phase inner ⅔ trellis coding, selection being made in accordance with a pattern that takes into account the M/H data bytes being positioned differently. These differences in the pattern of selection obtain owing to an additional FIC-Segment being included in each M/H Group and some dummy bytes being replaced by bytes of M/H data.

It will be apparent to those skilled in the art and acquainted with this disclosure that various modifications and variations can be made in the described DTV transmitter apparatus and in the described DTV receiver apparatus, using known equivalents of their component elements within the spirit or scope of the invention. Much of processing can be done by digital hardware programmed by appropriate software rather than by dedicated hardware and the scopes of the following claims should be construed so as to include such embodiments of the invention in its various aspects. In the claims which follow, the word "said" rather than the word "the" is used to indicate the existence of an antecedent basis for a term having being provided earlier in the claims. The word "the" is used for purposes other than to indicate the existence of an antecedent basis for a term having being provided earlier in the claims, the usage of the word "the" for other purposes being consistent with normal grammar in the American English language.

What is claimed is:

1. Receiver apparatus for vestigial-sideband amplitude-modulated carrier waves transmitting trellis-coded digital information, portions of which trellis-coded digital information comprise serially concatenated convolutional coding of fields of two-dimensionally-coded internet-protocol (IP) digital data randomized bit by bit, the two-dimensional coding of the randomized IP digital data in each said field including transversal Reed-Solomon (TRS) coding of columns of bytes of said randomized IP digital data in that field and cyclic-redundancy-check (CRC) coding of rows of said bytes of said randomized IP digital data and of parity bytes of said TRS coding in a respective extension of that field, instructions for decoding each said field of two-dimensionally-coded randomized IP digital data being signaled by transmission parameter channel (TPC) information transmitted in portions of said trellis-coded digital information other than those said portions that comprise said serially concatenated convolutional coding of fields of two-dimensionally-coded randomized IP digital data randomized bit by bit, said receiver apparatus comprising:

a demodulator connected for receiving vestigial-sideband amplitude-modulated carrier waves transmitting trellis-coded digital information and for supplying trellis-coded digital information at baseband;

a decoder for quarter-rate parallel concatenated convolutional coding connected for reproducing randomized signaling information, by decoding parallel concatenated convolutional coding (PCCC) selected from the baseband trellis-coded digital information supplied from said demodulator;

a signaling bits de-randomizer connected for reproducing signaling information including said transmission parameter channel (TPC) information and also including Fast Information channel (FIC) information, by de-randomizing bits of said randomized signaling information;

a turbo decoder connected for reproducing rows of bytes of said fields of two-dimensionally-coded IP digital data randomized bit by bit, by decoding serial concatenated convolutional coding (SCCC) selected from the baseband trellis-coded digital information supplied from said demodulator, said decoding of SCCC selected from the baseband trellis-coded digital information supplied from said demodulator being directed in its performance responsive to said TPC information;

byte-organized memory connected for storing rows of bytes of said fields of two-dimensionally-coded randomized IP digital data as written thereto from said turbo decoder, said byte-organized memory connected for having successive columns of stored bytes read therefrom as respective TRS codewords after essentially all the rows of bytes of one of said fields of two-dimensionally coded randomized digital data have been stored within said byte-organized memory;

a decoder for CRC coding of each row of bytes in one of said fields of two-dimensionally coded randomized digital data as written thereto from said turbo decoder;

a byte-error-location-information register for temporarily storing the decoding results from said decoder for CRC coding, which decoding results are temporarily stored to provide byte-error-location information until completion of decoding of the TRS codewords in said one of said fields of two-dimensionally-coded randomized IP digital data;

a bank of respective decoders for Reed-Solomon coding of assorted types having different forward-error-correction capabilities, one of said decoders for Reed-Solomon coding being selected responsive to said TPC information for receiving said successive columns of stored bytes read from said byte-organized memory after essentially all the rows of bytes of one of said fields of two-dimensionally-coded randomized IP digital data have been stored therewithin, said selected one of said decoders for Reed-Solomon coding connected for receiving from said byte-error-location-information register the temporarily stored decoding results from said decoder for CRC coding and using them for locating possibly erroneous bytes in said TRS codewords, said selected one of said decoders for Reed-Solomon coding connected for writing corrected randomized digital data back into said byte-organized memory; and a data de-randomizer connected for receiving rows of bytes of each of said fields of two-dimensionally-coded randomized IP digital data, as read from said byte-organized memory after forward error correction by said selected one of said decoders for Reed-Solomon coding is completed, and responding to reproduce said IP digital data.

2. Receiver apparatus as set forth in claim 1, for usefully receiving vestigial-sideband amplitude-modulated carrier waves transmitting trellis-coded digital information wherein said TRS codewords are all of a standard length in number of bytes therein irrespective of various permissible strengths of said TRS coding, a respective strength of said TRS codewords in each said field of two-dimensionally-coded randomized digital data being signaled by said transmission parameter channel information, said receiver apparatus characterized by said byte-error-location-information register temporarily storing a fixed number of bits equal to the number of bytes in each of said TRS codewords of said standard length.

3. Receiver apparatus as set forth in claim 2, wherein said standard length of all said TRS codewords is 235 bytes.

4. Receiver apparatus as set forth in claim 2, wherein said turbo decoder is connected for usefully decoding SCCC selected from the baseband trellis-coded digital information supplied from said demodulator, which SCCC is transmitted together with periodic sequences of PCCC each encoding 10 bytes of TPC and at least 37 bytes of FIC.

5. Receiver apparatus as set forth in claim 2, wherein said turbo decoder is connected for usefully decoding SCCC selected from the baseband trellis-coded digital information supplied from said demodulator, which SCCC is transmitted together with periodic sequences of PCCC each encoding 10 bytes of TPC and more than 37 bytes of FIC.

6. Receiver apparatus as set forth in claim 5, wherein said turbo decoder is connected for usefully decoding SCCC selected from the baseband trellis-coded digital information supplied from said demodulator, which SCCC is transmitted together with periodic sequences of PCCC each encoding 10 bytes of TPC and 74 bytes of FIC.

7. Receiver apparatus as set forth in claim 1, wherein said turbo decoder is connected for usefully decoding SCCC selected from the baseband trellis-coded digital information supplied from said demodulator, which SCCC is transmitted together with periodic sequences of PCCC each encoding 10 bytes of TPC and more than 37 bytes of FIC.

8. Receiver apparatus as set forth in claim 7, wherein said turbo decoder is connected for usefully decoding SCCC selected from the baseband trellis-coded digital information supplied from said demodulator, which SCCC is transmitted together with periodic sequences of PCCC each encoding 10 bytes of TPC and 74 bytes of FIC.

* * * * *